(12) United States Patent
Jang

(10) Patent No.: US 12,069,354 B2
(45) Date of Patent: Aug. 20, 2024

(54) CAMERA MODULE

(71) Applicant: LG INNOTEK CO., LTD., Seoul (KR)

(72) Inventor: Young Bae Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 415 days.

(21) Appl. No.: 17/293,391

(22) PCT Filed: Oct. 31, 2019

(86) PCT No.: PCT/KR2019/014618
§ 371 (c)(1),
(2) Date: May 12, 2021

(87) PCT Pub. No.: WO2020/101232
PCT Pub. Date: May 22, 2020

(65) Prior Publication Data
US 2022/0014653 A1    Jan. 13, 2022

(30) Foreign Application Priority Data

Nov. 13, 2018 (KR) ........................ 10-2018-0138617

(51) Int. Cl.
*H04N 23/54*    (2023.01)
*G02B 3/14*    (2006.01)
(Continued)

(52) U.S. Cl.
CPC ........... *H04N 23/54* (2023.01); *G02B 27/646* (2013.01); *H04N 23/55* (2023.01); *H05K 1/181* (2013.01);
(Continued)

(58) Field of Classification Search
CPC ........ H04N 23/54; H04N 23/55; H04N 23/57; H04N 23/51; G02B 27/646; G02B 3/14;
(Continued)

(56) References Cited

U.S. PATENT DOCUMENTS 9,746,690 B2   8/2017   Enta
9,804,408 B2   10/2017   Rho et al.
(Continued)

FOREIGN PATENT DOCUMENTS

CN    105446053 A    3/2016
JP    2014-115493 A    6/2014
(Continued)

*Primary Examiner* — Christopher K Peterson
(74) *Attorney, Agent, or Firm* — Birch, Stewart, Kolasch & Birch, LLP

(57) ABSTRACT

An actuator including a first circuit board on which an image sensor is disposed, a first housing disposed on the first circuit board, a lens assembly disposed within the first housing, and a second circuit board disposed on the first side portion of the first housing where a gyro sensor is disposed, and a third circuit board driving the lens assembly is provided. The third circuit board may include a first region disposed on the first side portion of the first housing and in which a first coil driving the lens assembly is disposed. The first coil may overlap the second circuit board in a direction perpendicular to an optical axis direction.

15 Claims, 31 Drawing Sheets

(51) Int. Cl.
  *G02B 5/04* (2006.01)
  *G02B 27/64* (2006.01)
  *H04N 23/55* (2023.01)
  *H05K 1/18* (2006.01)
(52) U.S. Cl.
  CPC ............... *H05K 1/183* (2013.01); *G02B 3/14* (2013.01); *G02B 5/04* (2013.01); *H05K 2201/10151* (2013.01)
(58) Field of Classification Search
  CPC ........ G02B 5/04; G02B 13/007; G02B 7/102; H05K 1/181; H05K 1/183; H05K 2201/10151
  See application file for complete search history.

(56) References Cited

U.S. PATENT DOCUMENTS

| | | |
|---|---|---|
| 9,891,443 B2 | 2/2018 | Hamada et al. |
| 10,197,887 B2 | 2/2019 | Enta |
| 2012/0140326 A1 | 6/2012 | Takeda et al. |
| 2013/0194442 A1 | 8/2013 | Yazawa |
| 2015/0370086 A1 | 12/2015 | Hamada et al. |
| 2016/0085086 A1 | 3/2016 | Rho et al. |
| 2016/0357294 A1* | 12/2016 | Ozeki .................... B32B 17/06 |
| 2018/0164537 A1 | 6/2018 | Lee |
| 2018/0173080 A1 | 6/2018 | Enta |
| 2018/0239161 A1 | 8/2018 | Seol et al. |
| 2018/0239162 A1 | 8/2018 | Lee et al. |
| 2018/0364450 A1* | 12/2018 | Lee ........................ H04N 23/55 |
| 2019/0219892 A1 | 7/2019 | Park et al. |

FOREIGN PATENT DOCUMENTS

| | | |
|---|---|---|
| JP | 2016-33685 A | 3/2016 |
| JP | 2016-224262 A | 12/2016 |
| KR | 10-2018-0045239 A | 5/2018 |
| KR | 10-2018-0065687 A | 6/2018 |
| KR | 10-2018-0095420 A | 8/2018 |
| KR | 10-2018-0116965 A | 10/2018 |
| WO | WO 2014/092070 A1 | 6/2014 |
| WO | WO 2016/194345 A1 | 12/2016 |

\* cited by examiner

[FIG. 1]
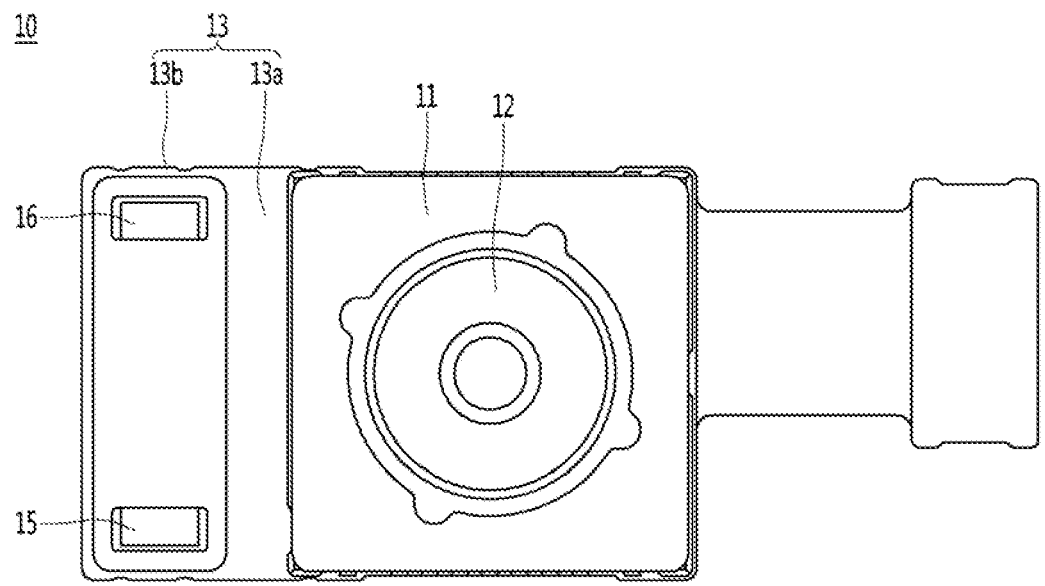
[FIG. 2]
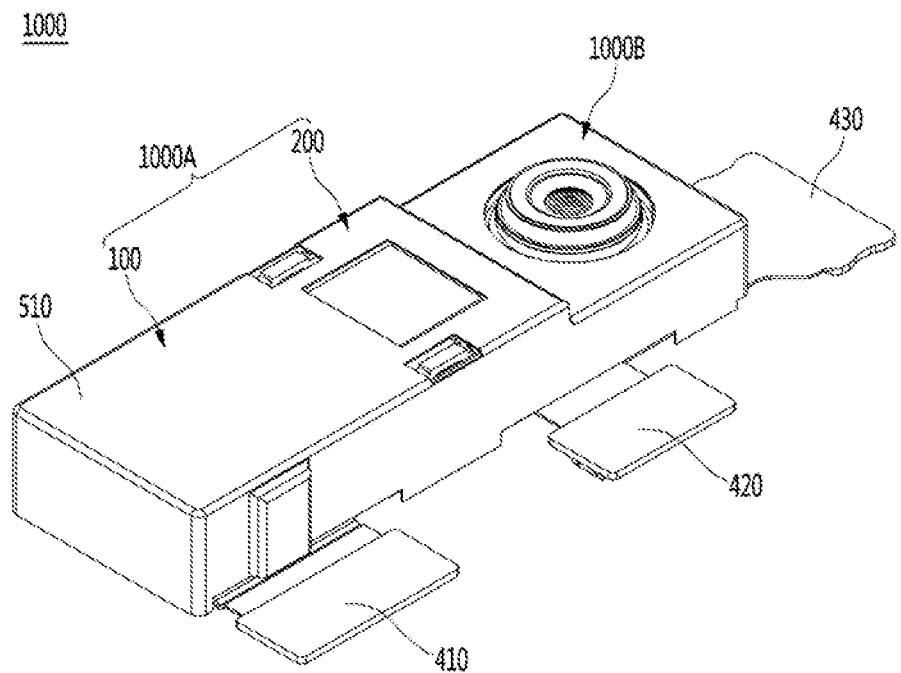

[FIG. 3a]
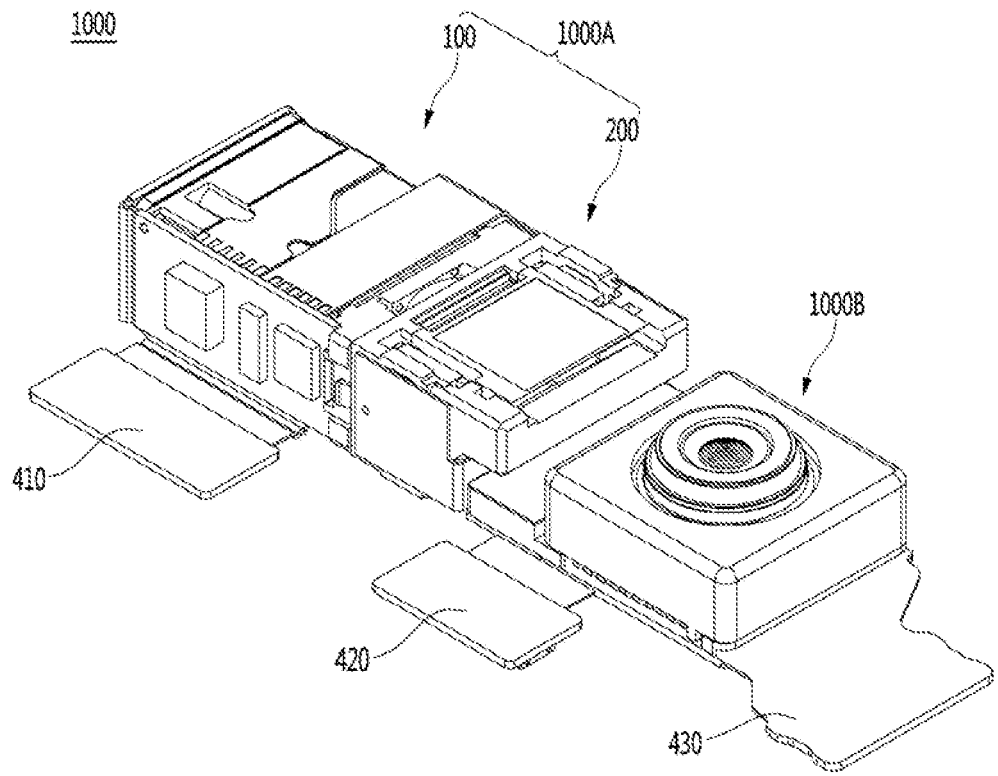
[FIG. 3b]
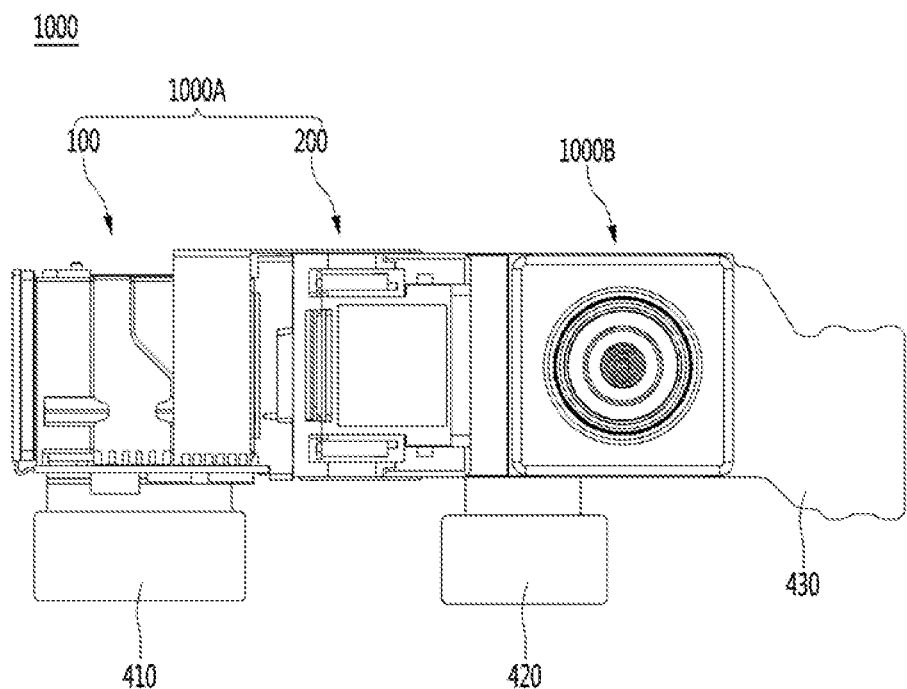

[FIG. 4a]
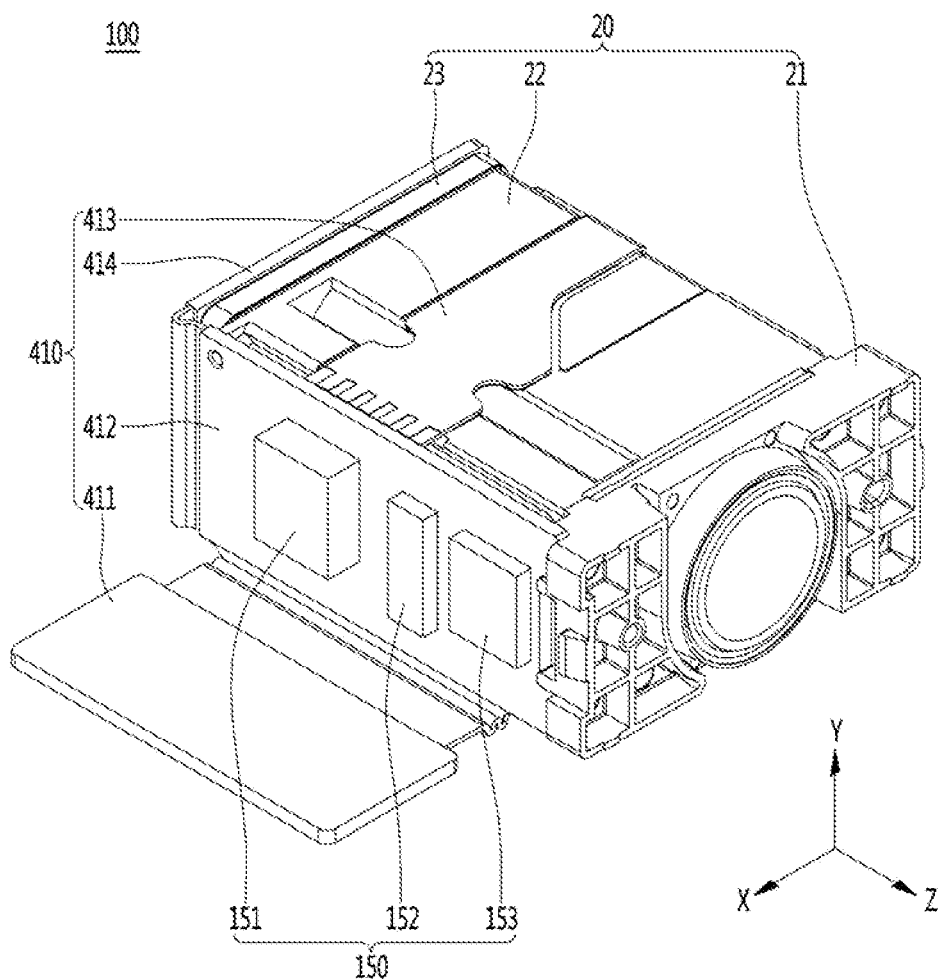

[FIG. 4b]
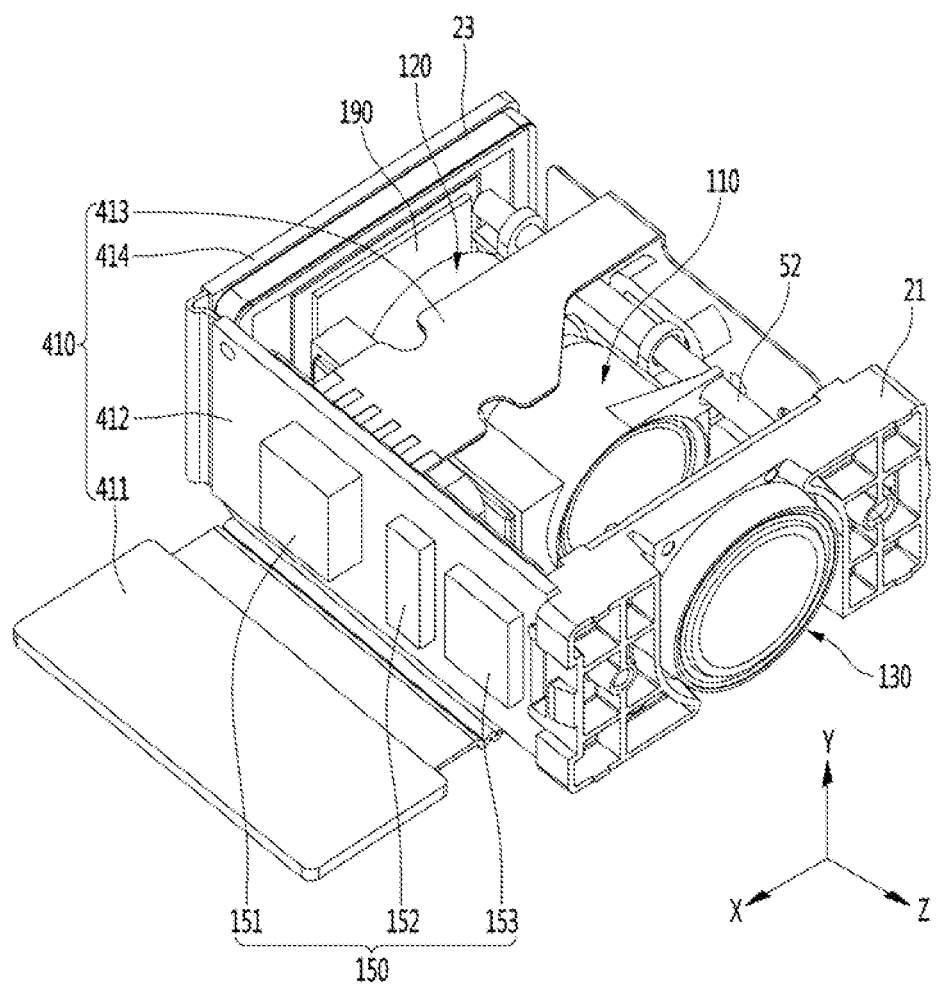

[FIG. 5a]
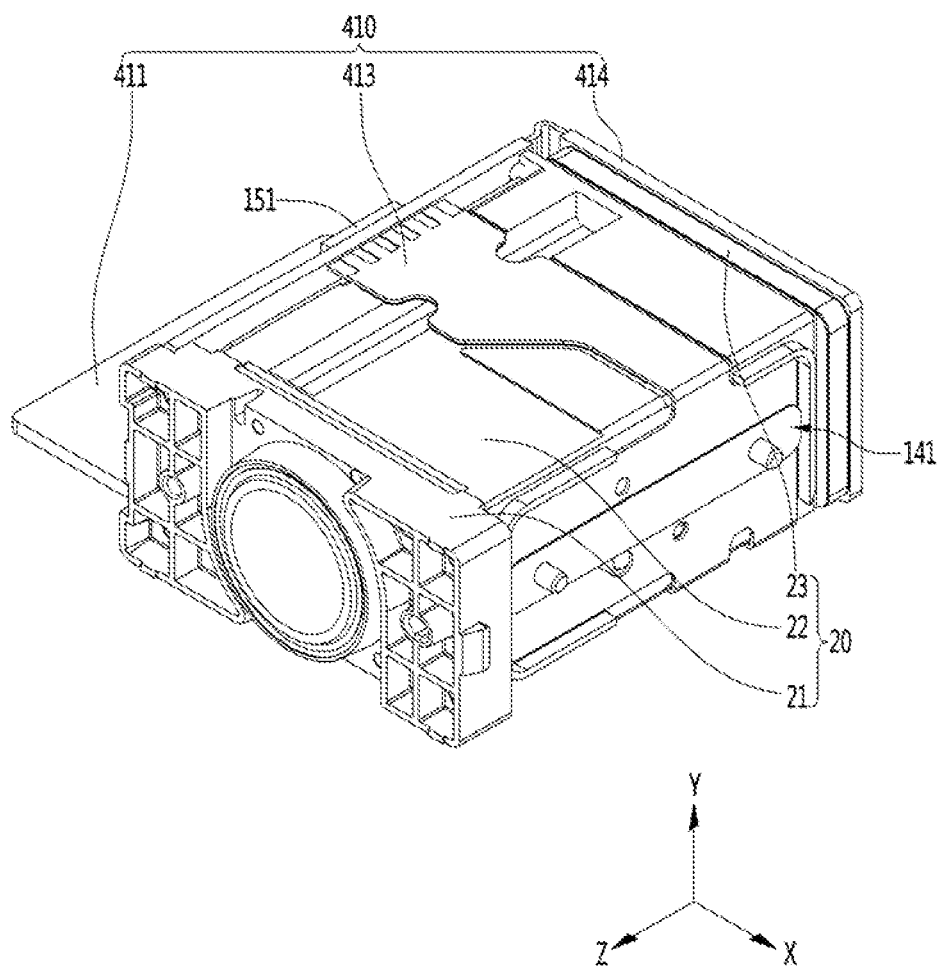

[FIG. 5b]
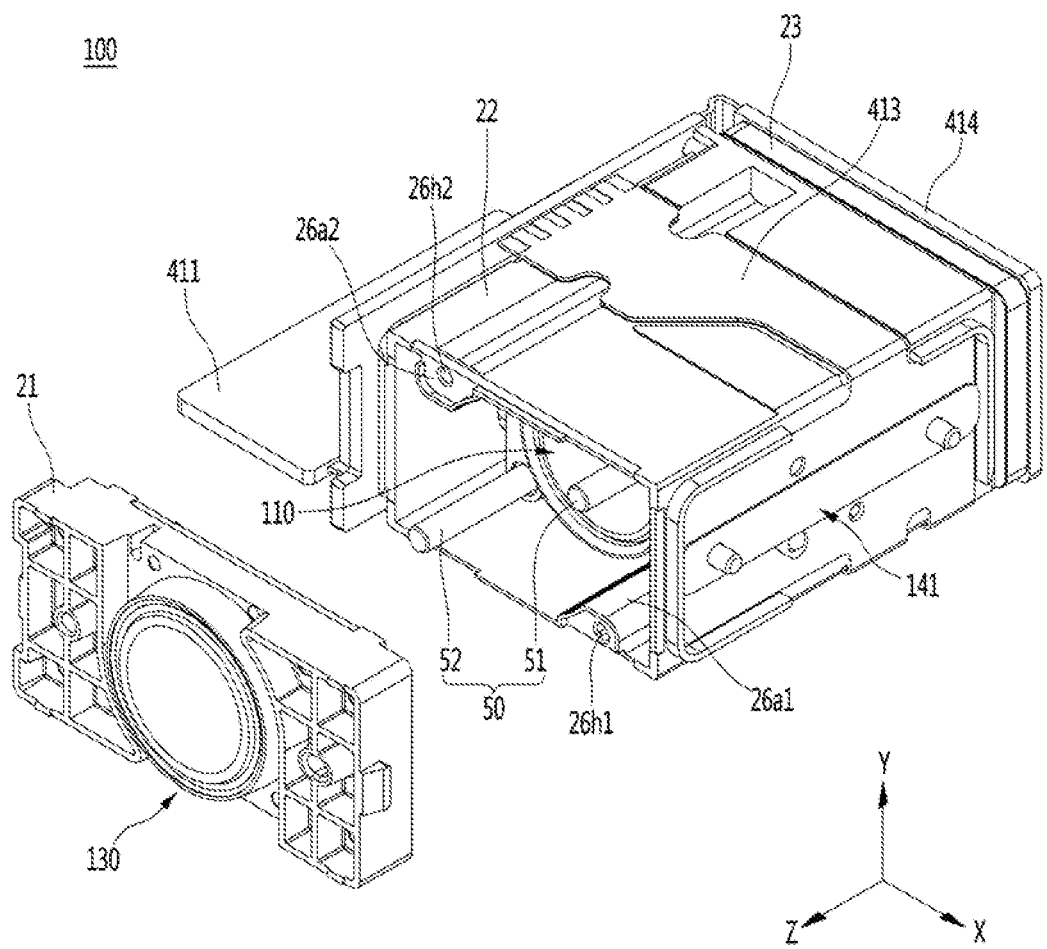

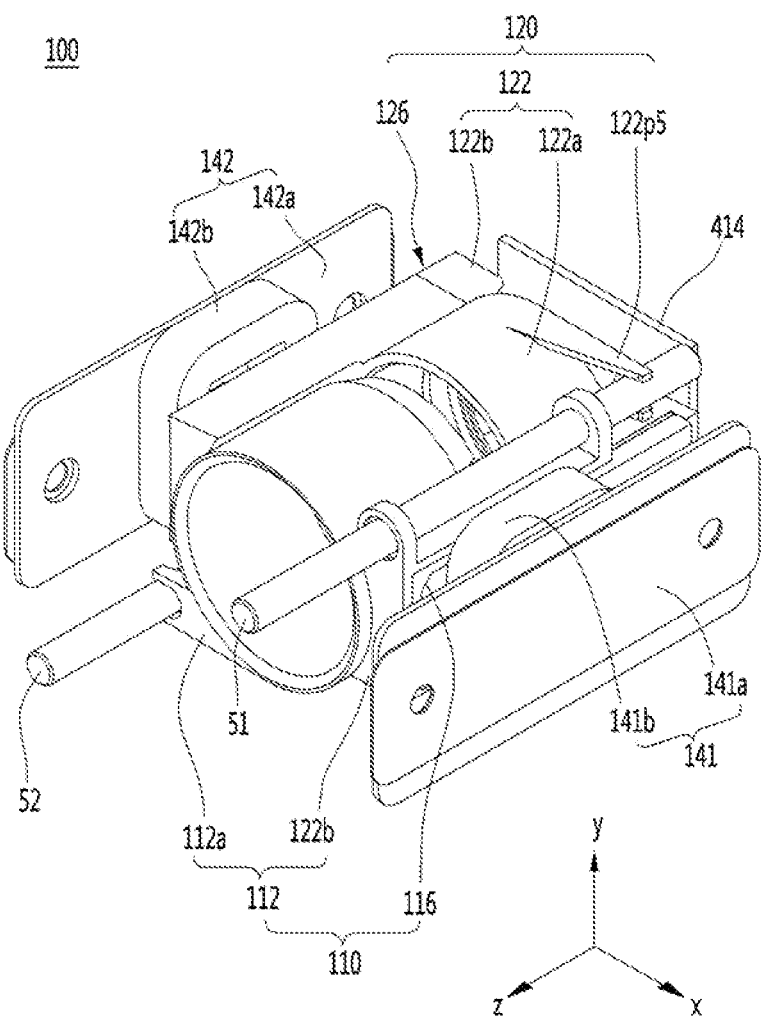
[FIG. 6]

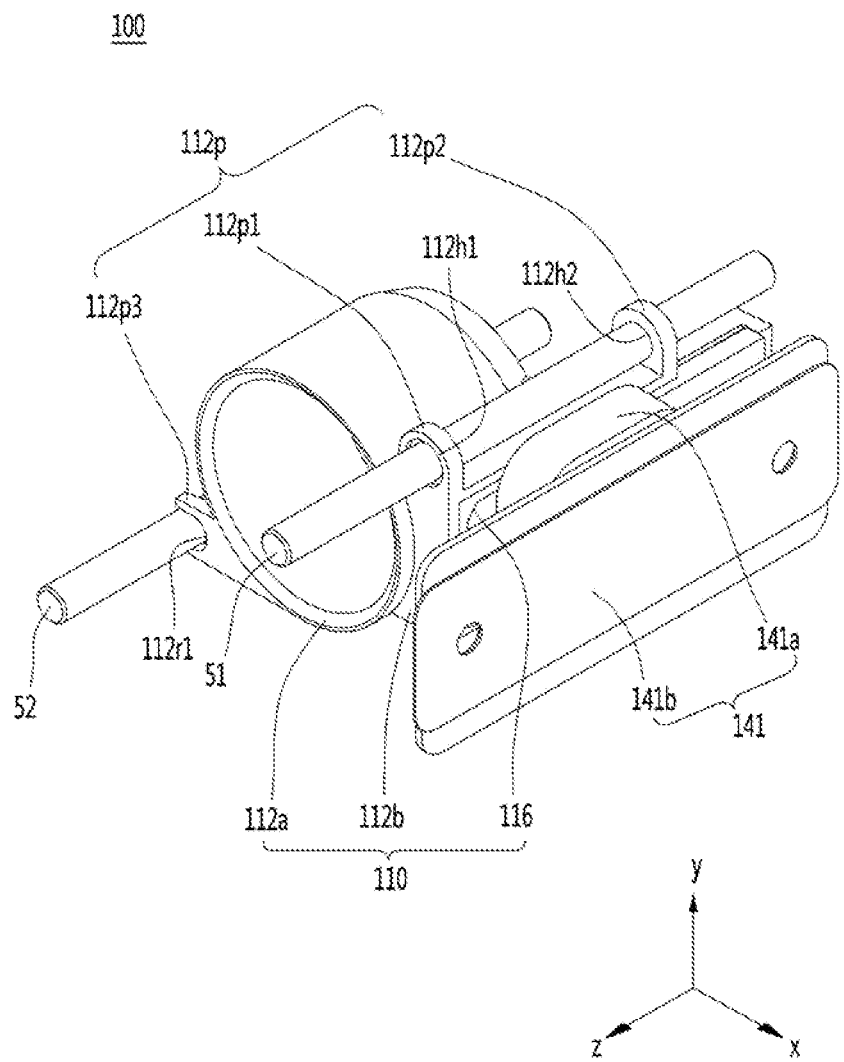
[FIG. 7]

[FIG. 8]
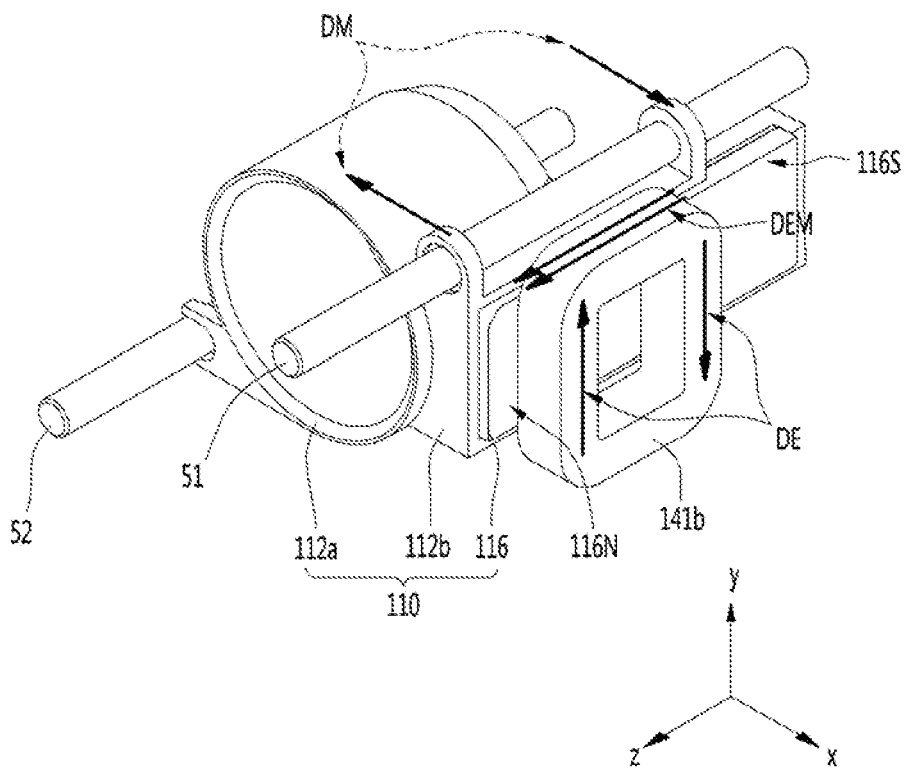

[FIG. 9]
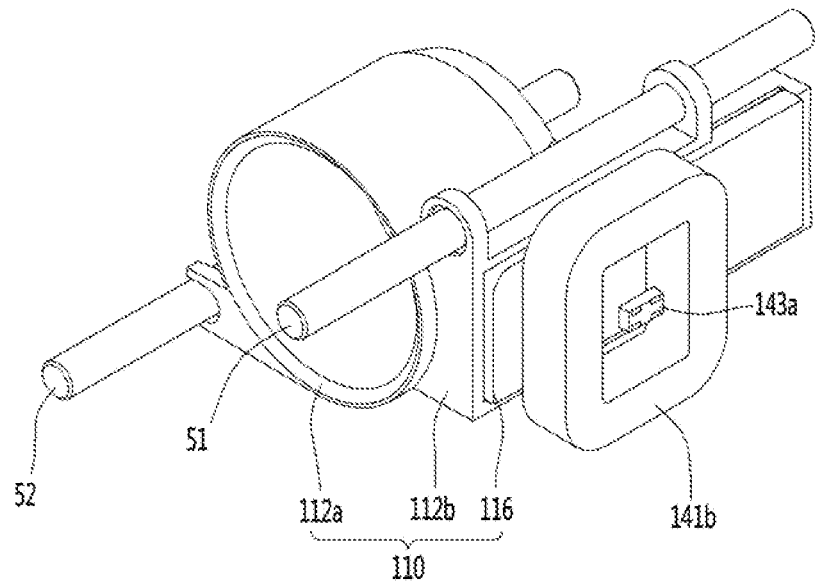
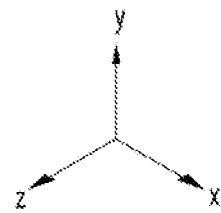
[FIG. 10]
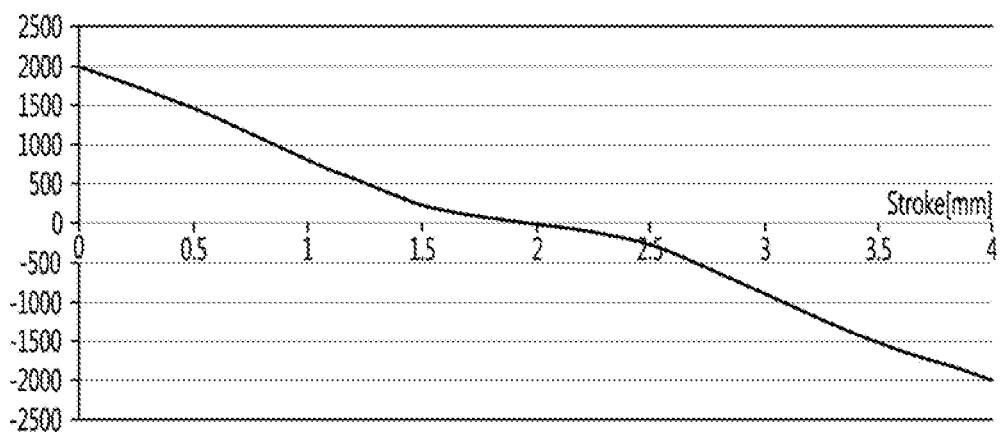

[FIG. 11a]
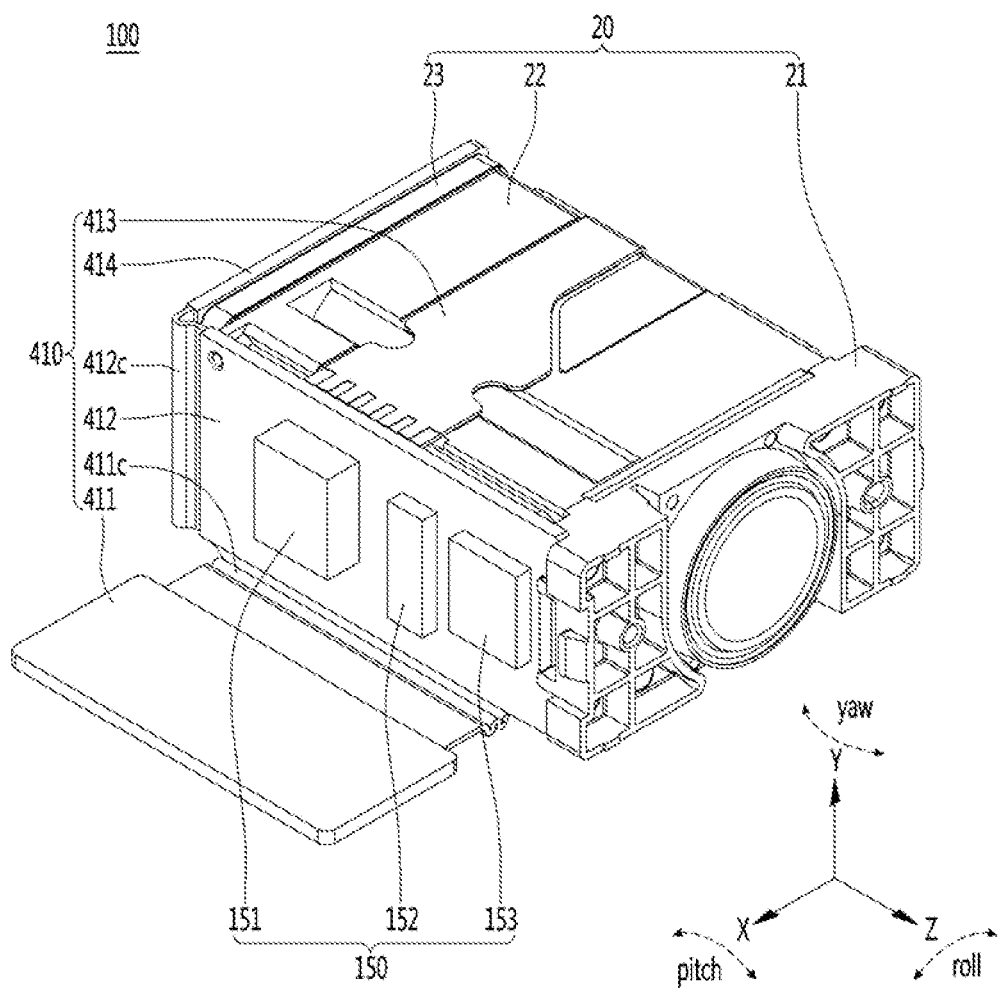

[FIG. 11b]
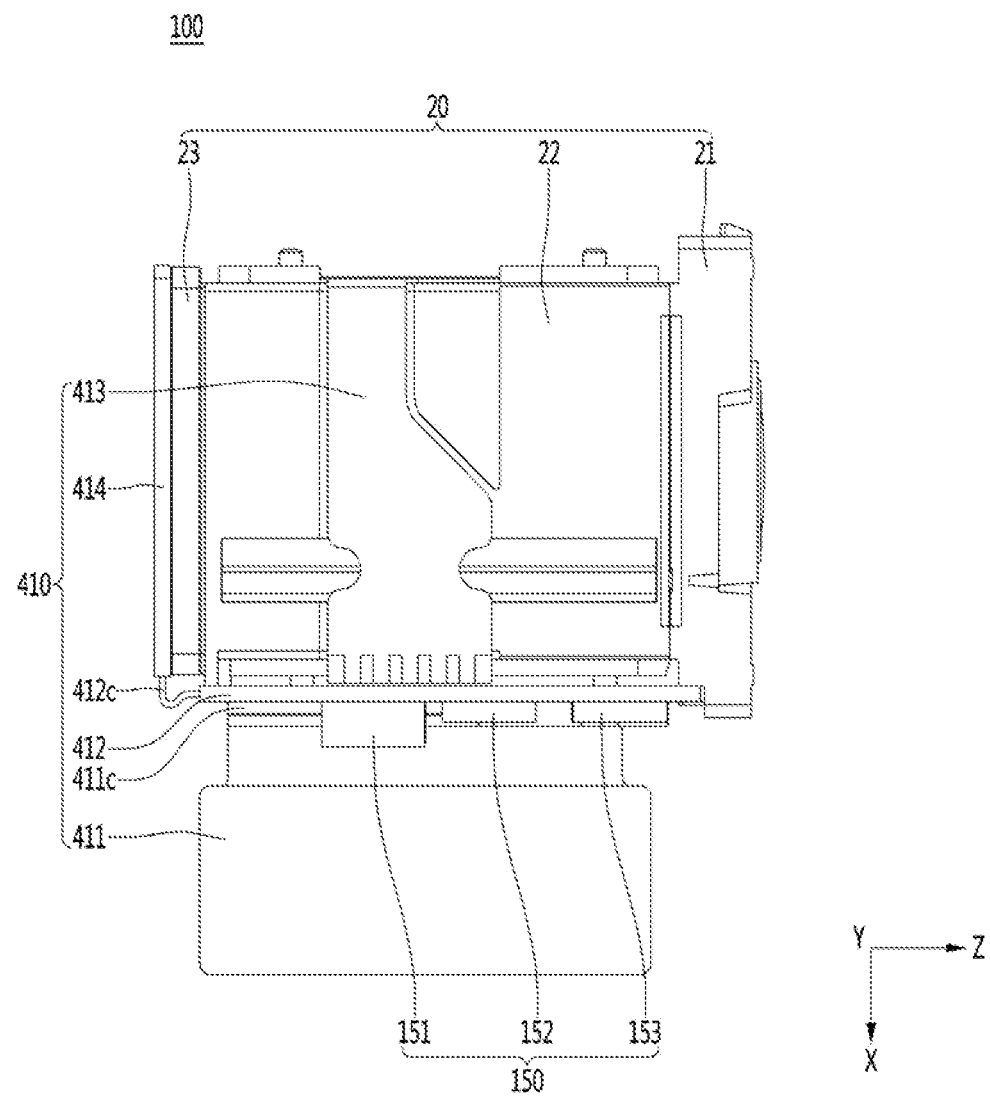

[FIG. 11c]
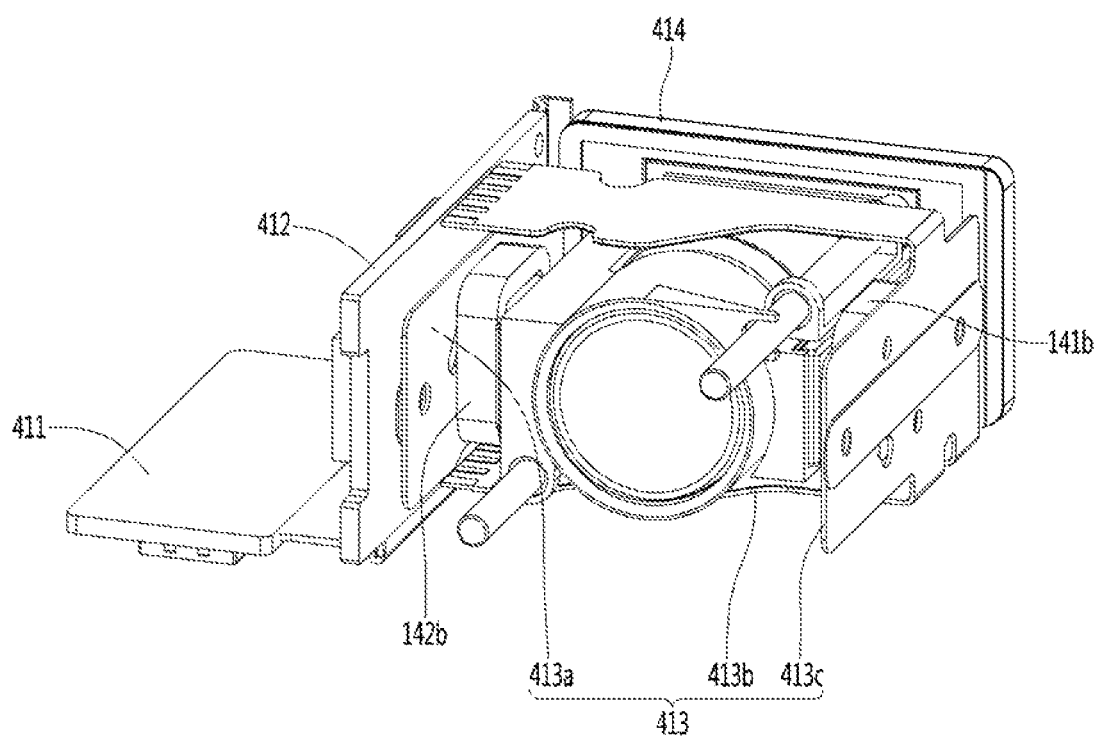

[FIG. 11d]
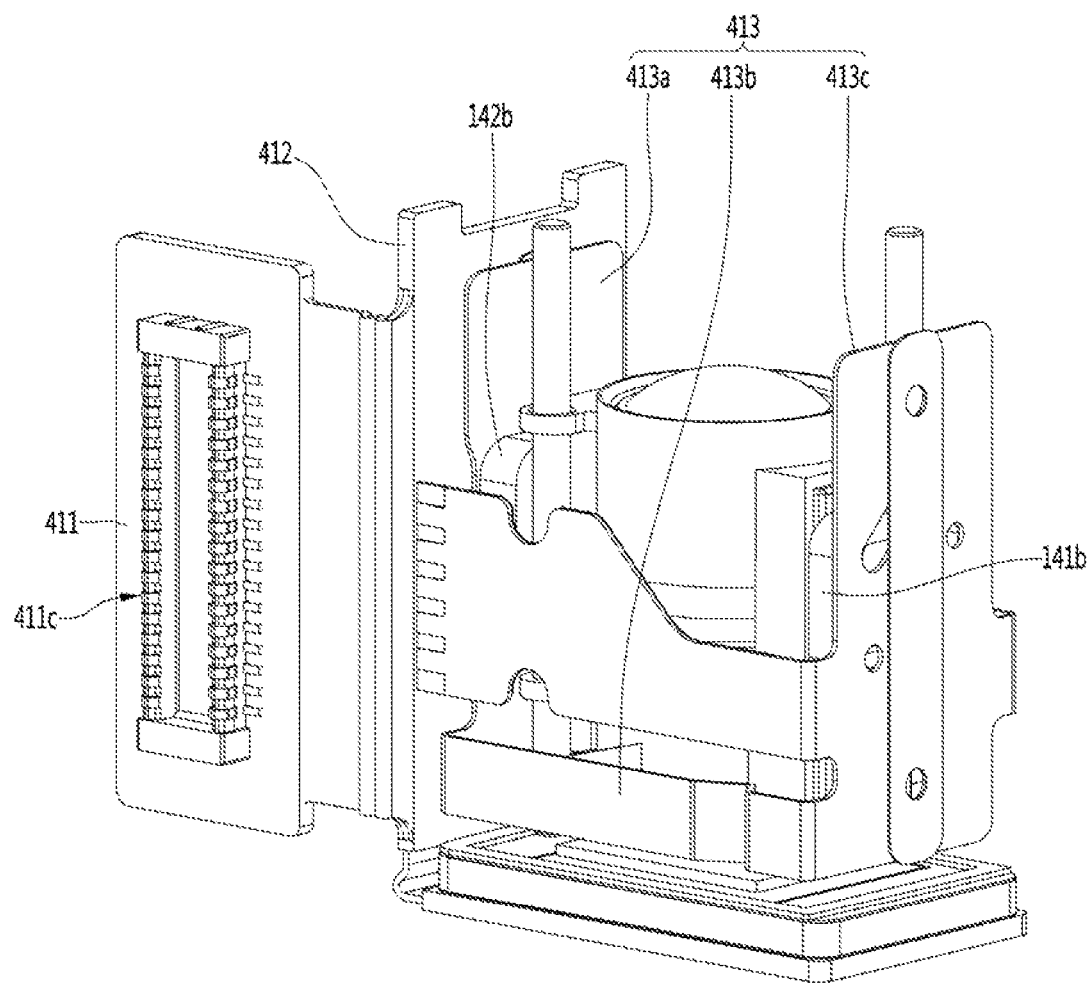

[FIG. 11e]
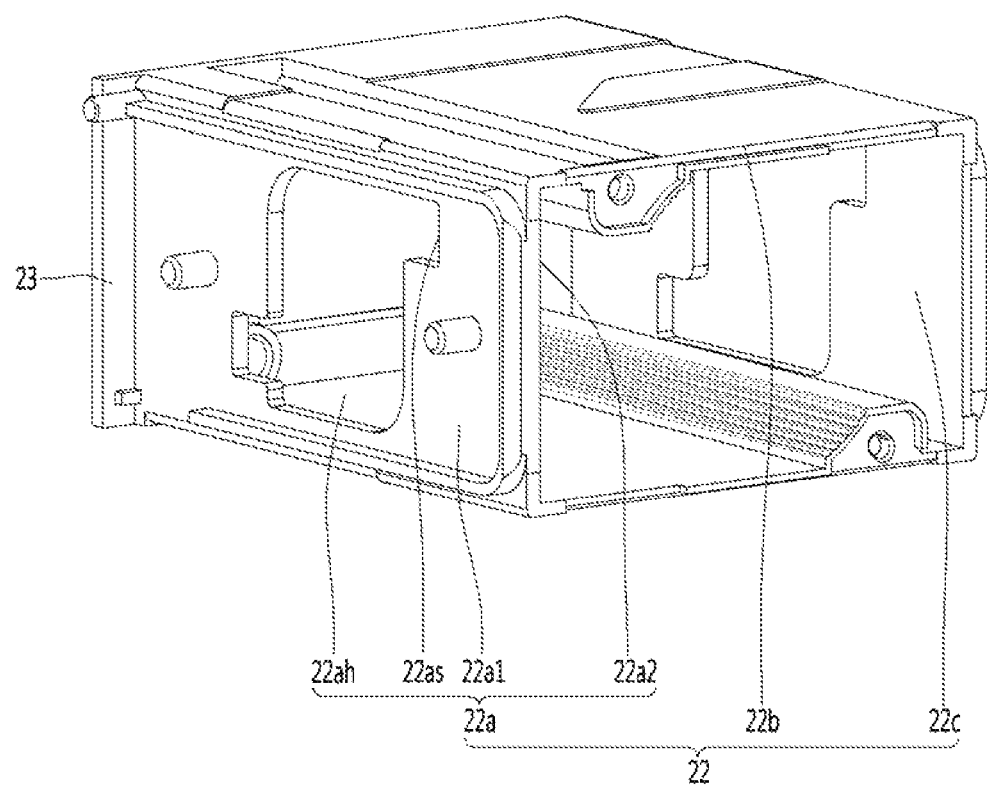

[FIG. 12a]
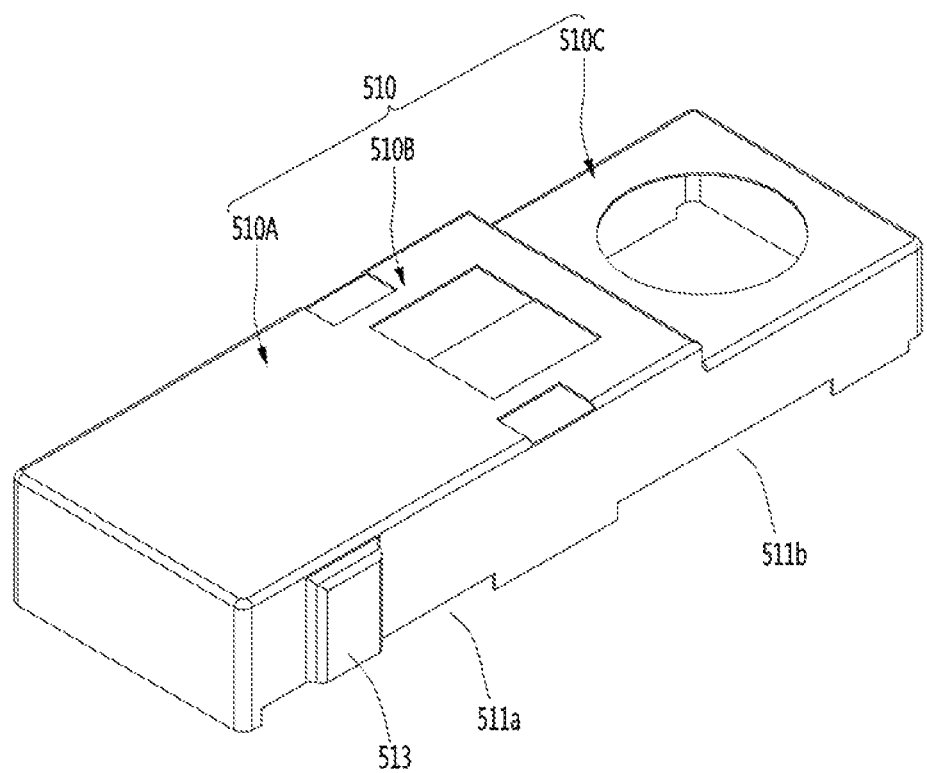
[FIG. 12b]
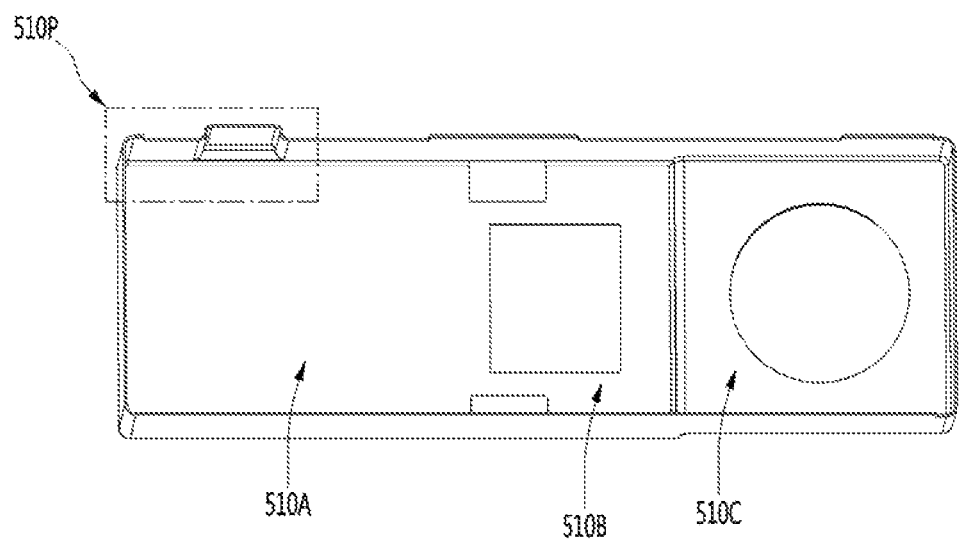

[FIG. 13]
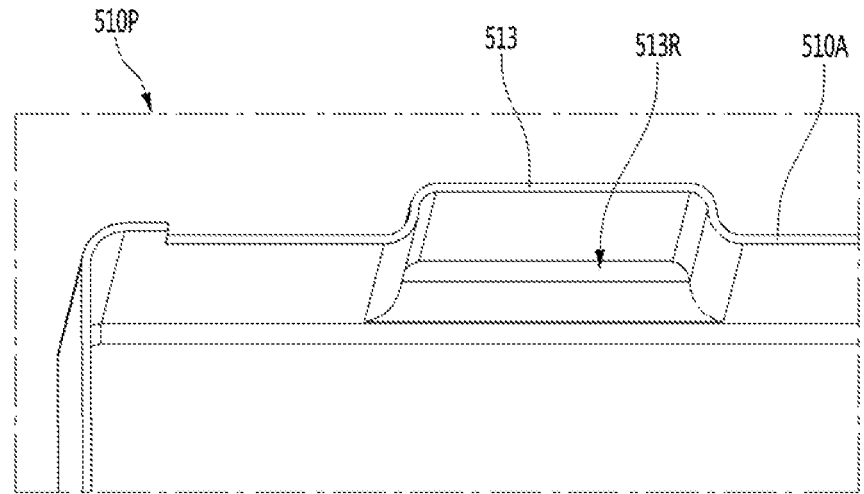
[FIG. 14a]
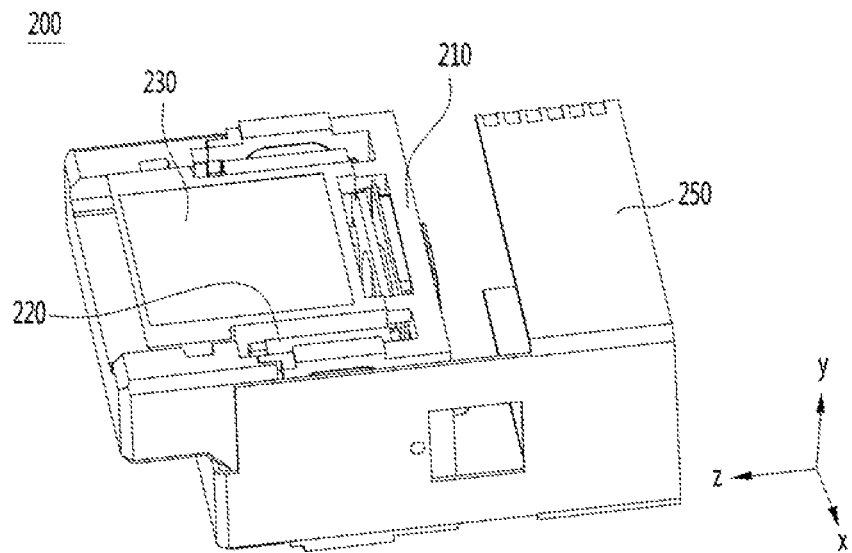

[FIG. 14b]
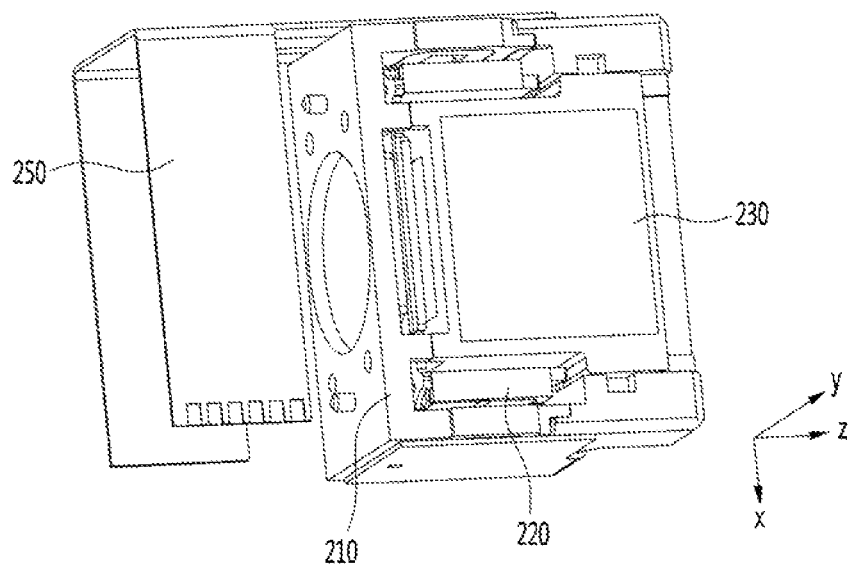
[FIG. 15]
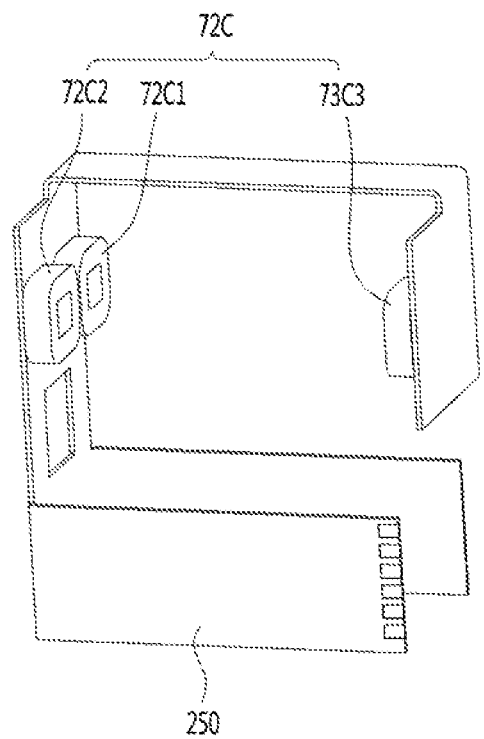

[FIG. 16a]
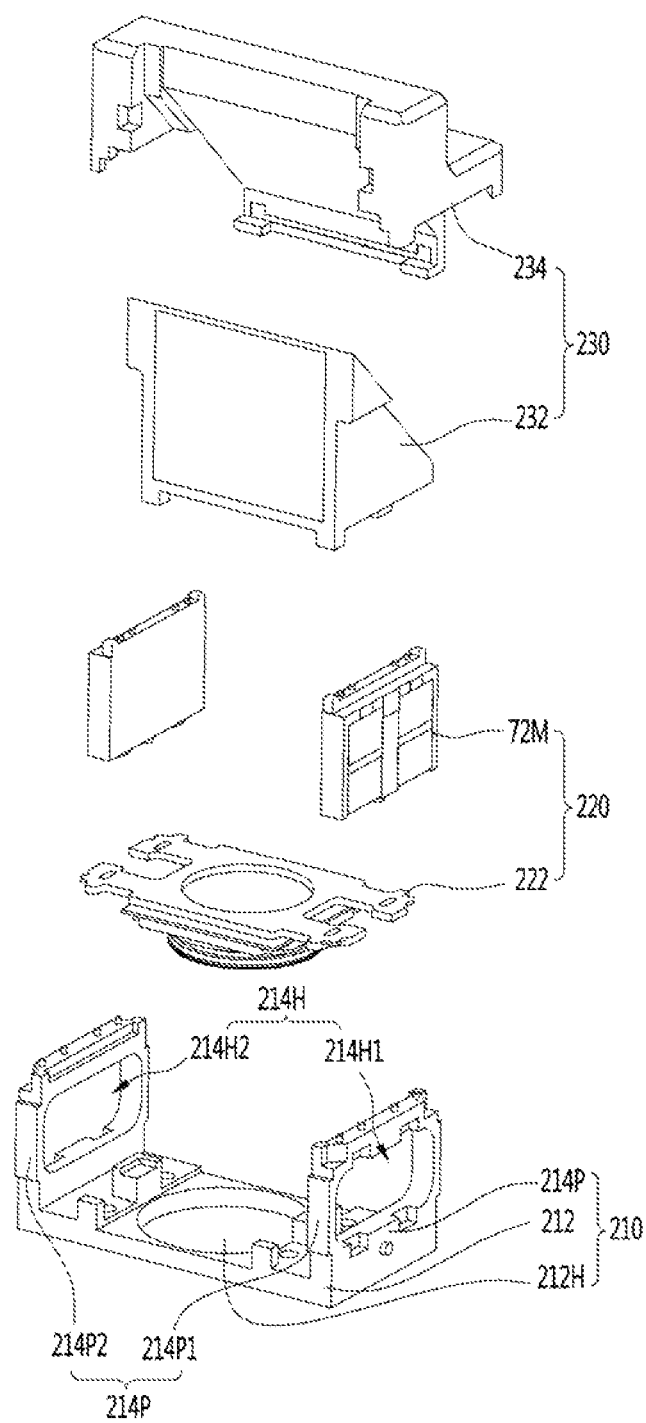

[FIG. 16b]
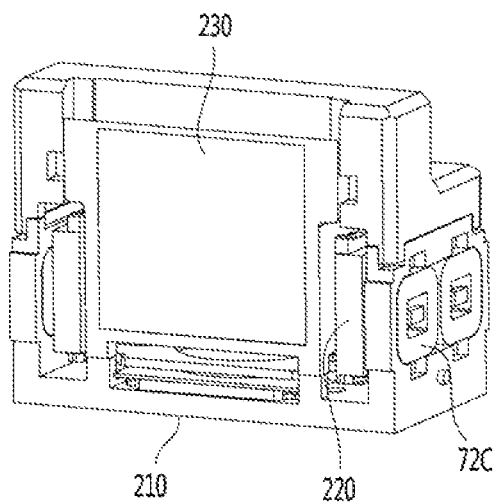
[FIG. 17a]
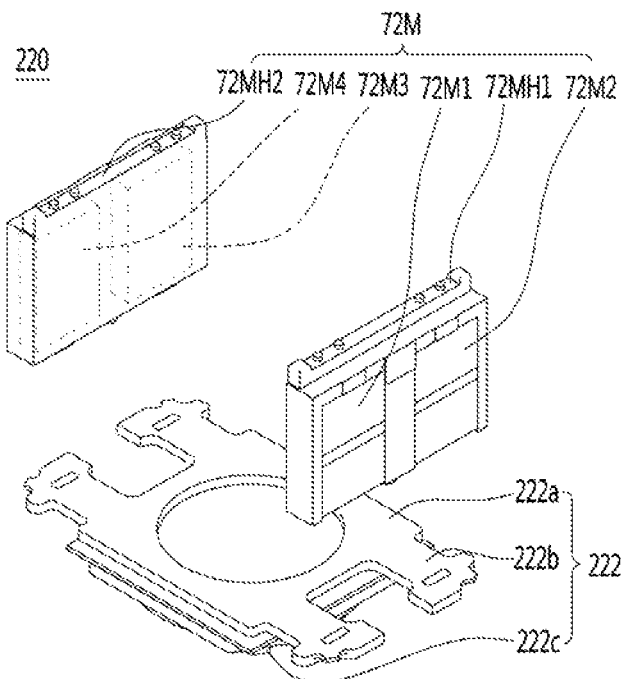

[FIG. 17b]
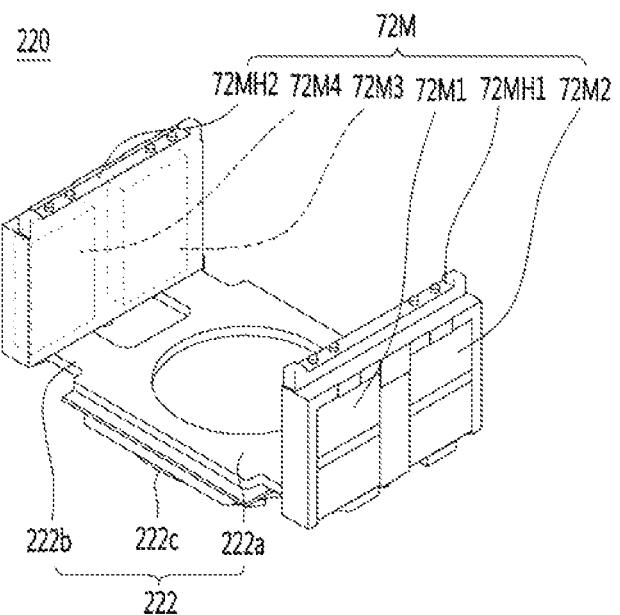
[FIG. 17c]
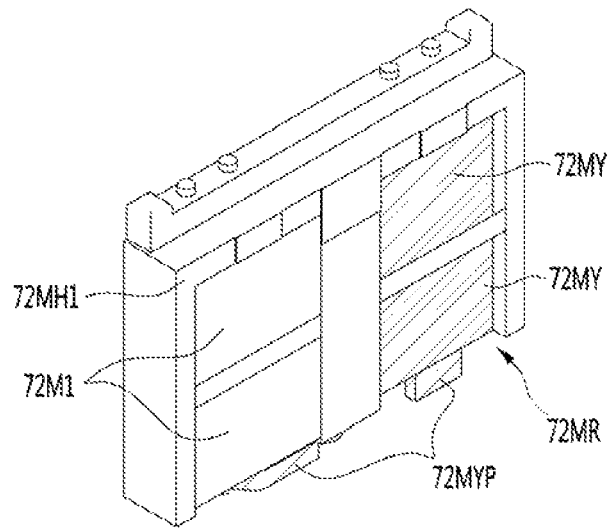

[FIG. 18]
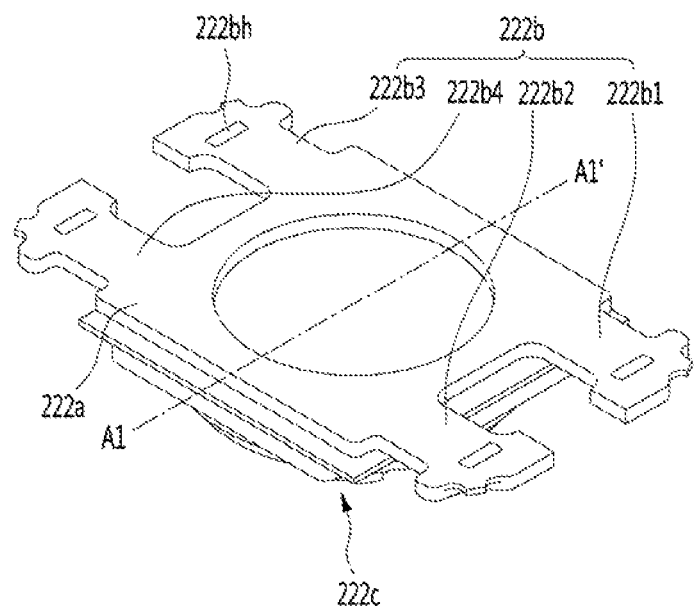
[FIG. 19]
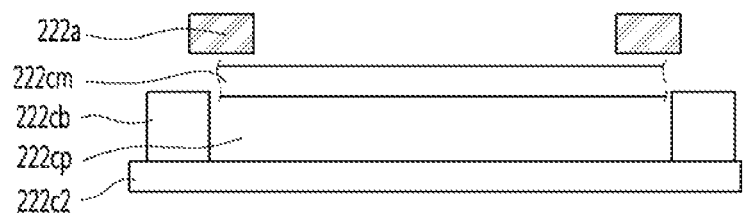

[FIG. 20a]
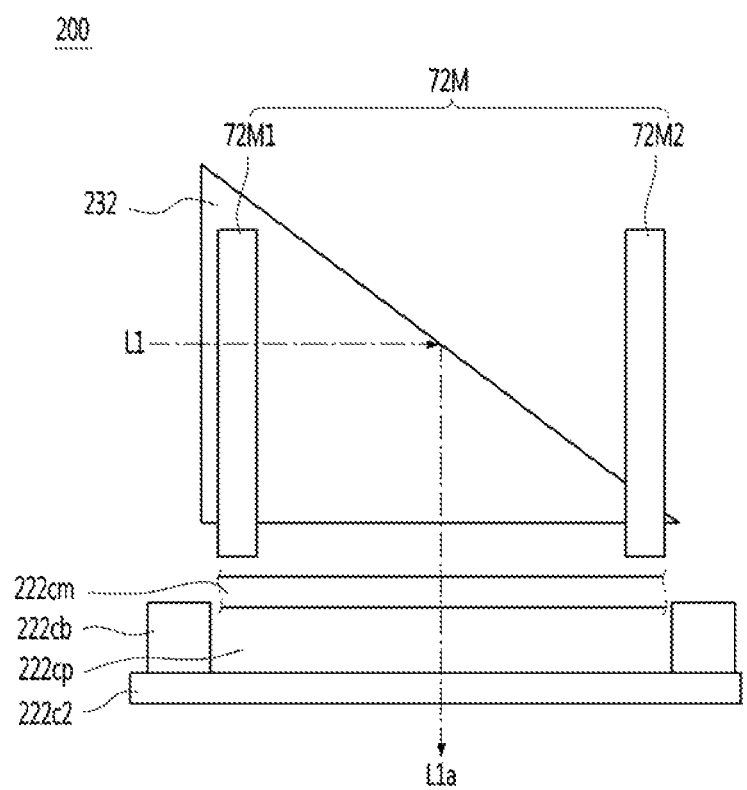

[FIG. 20b]
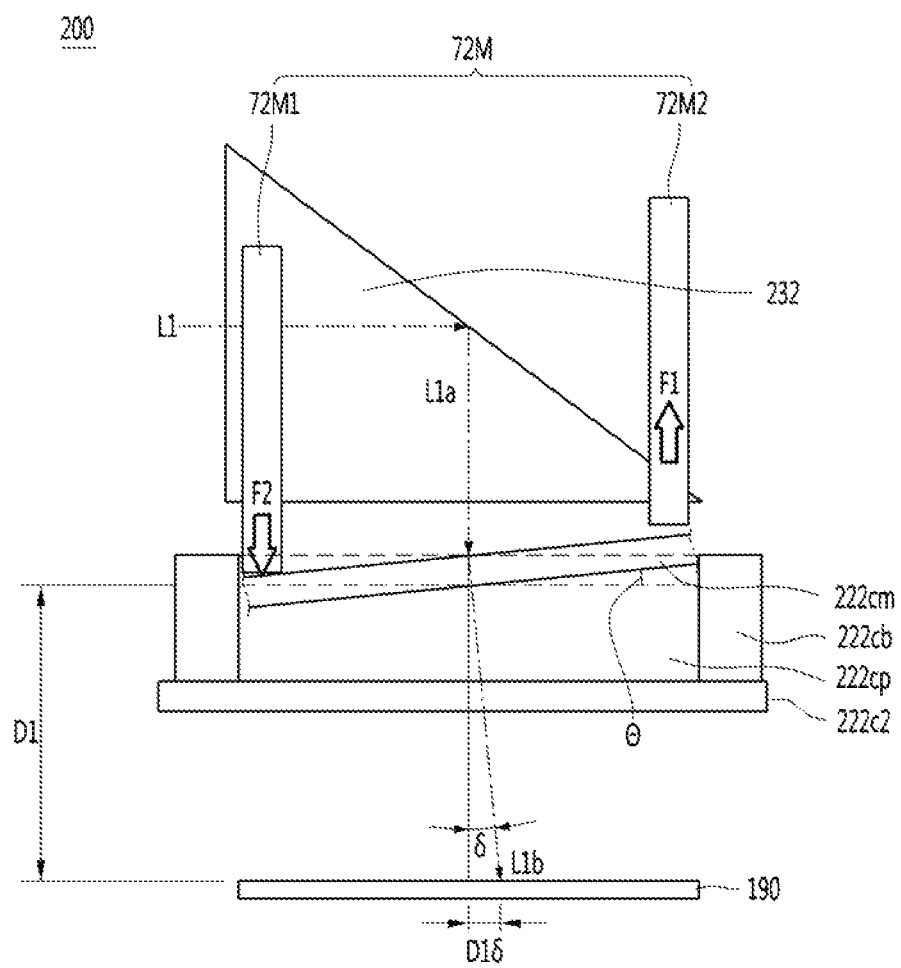

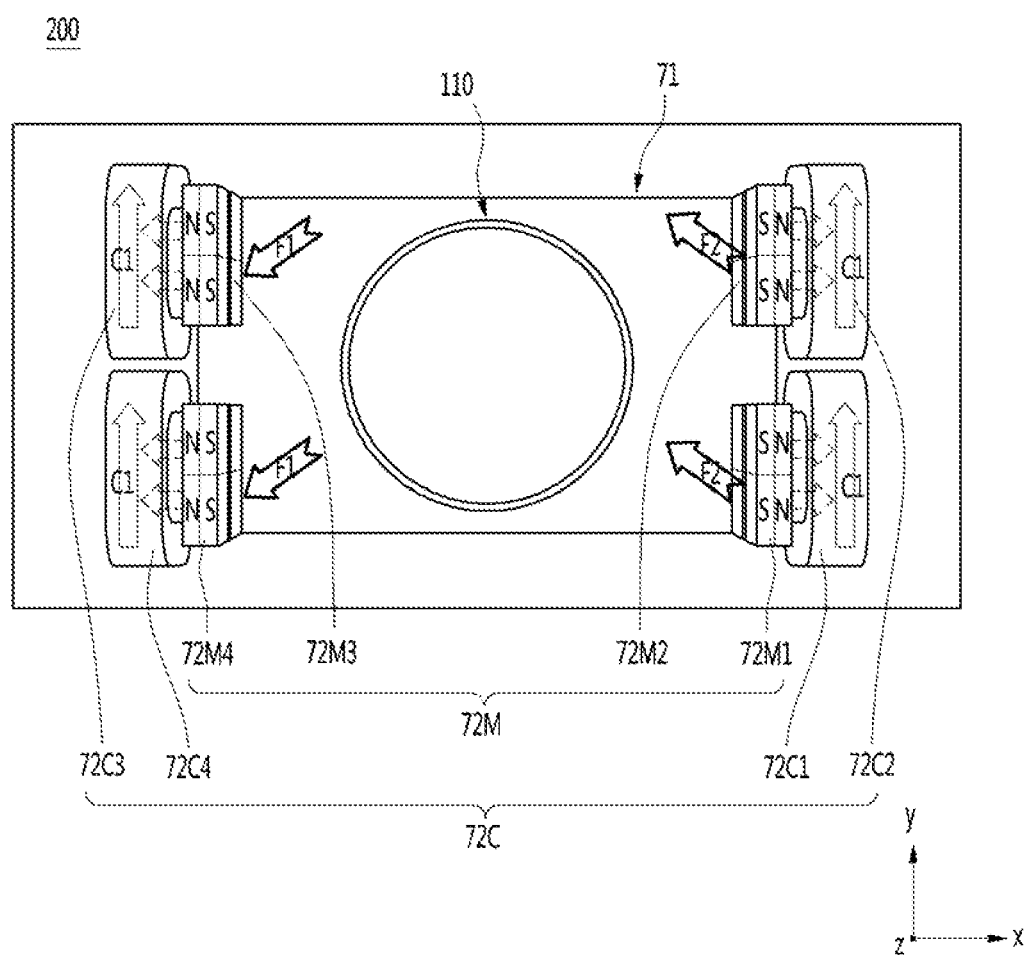
[FIG. 21a]

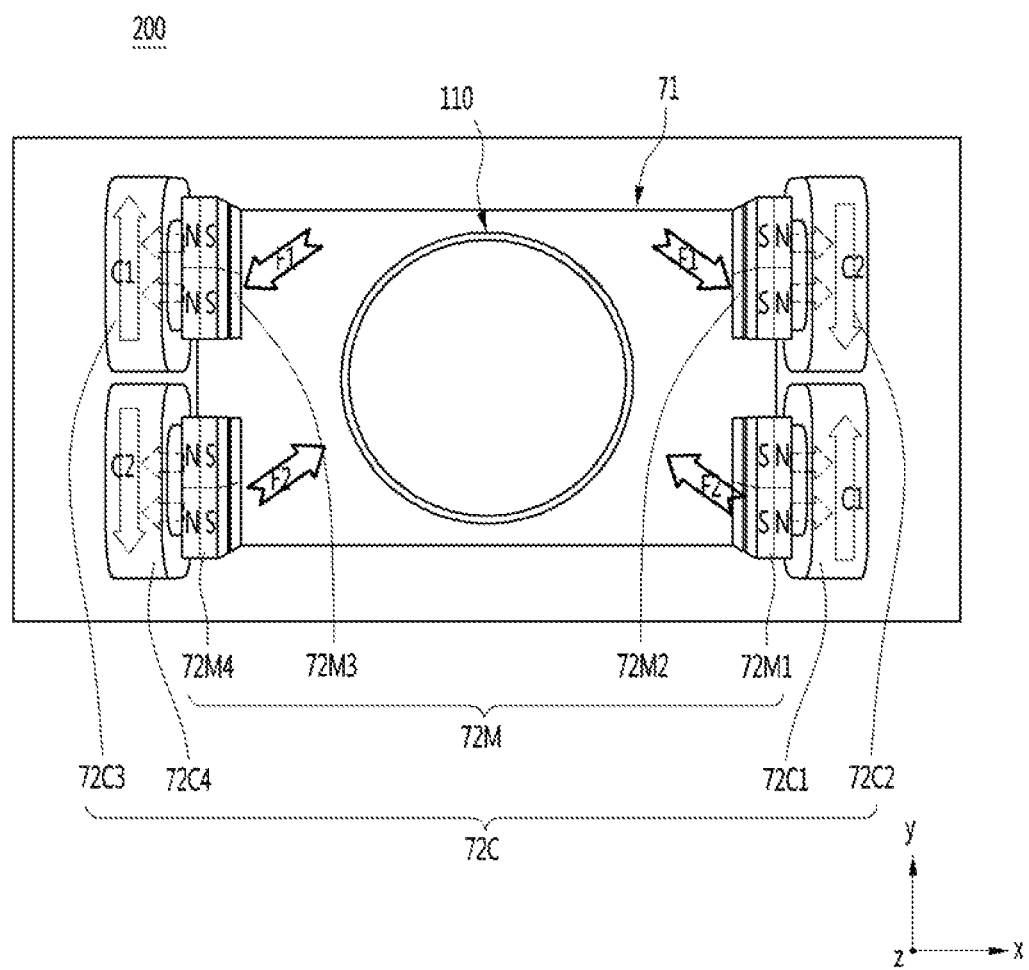
[FIG. 21b]

[FIG. 22]
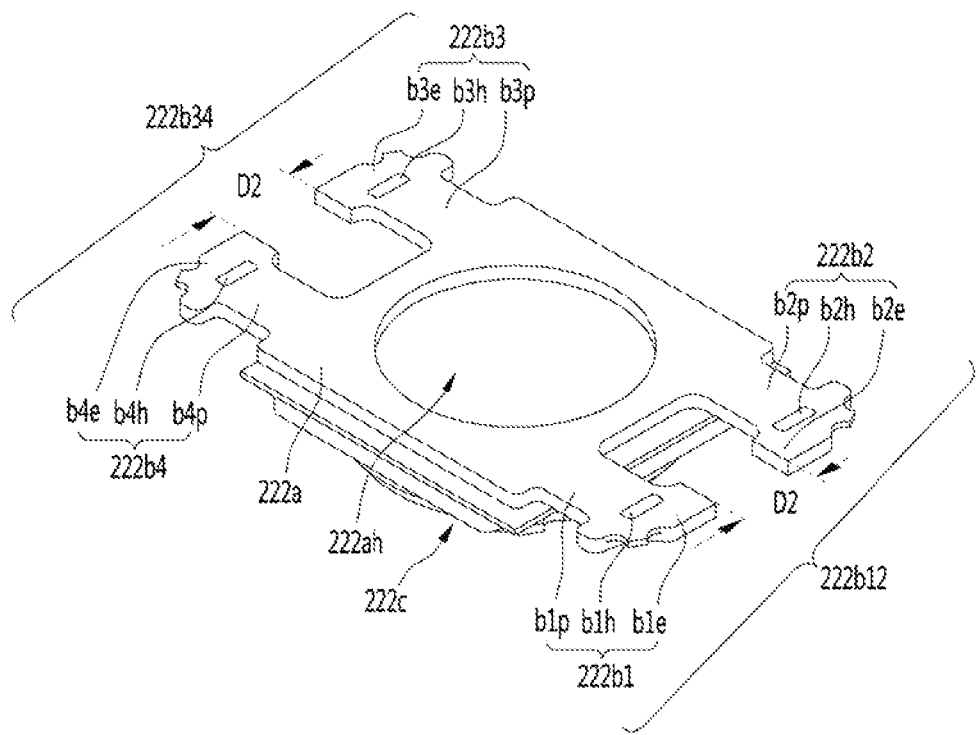

[FIG. 23]
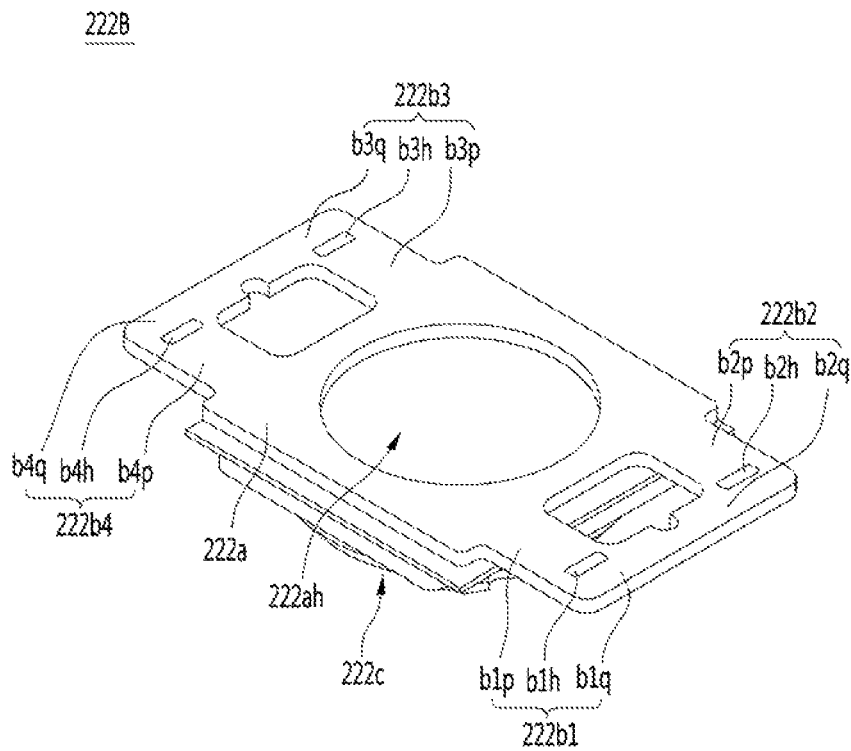
[FIG. 24]
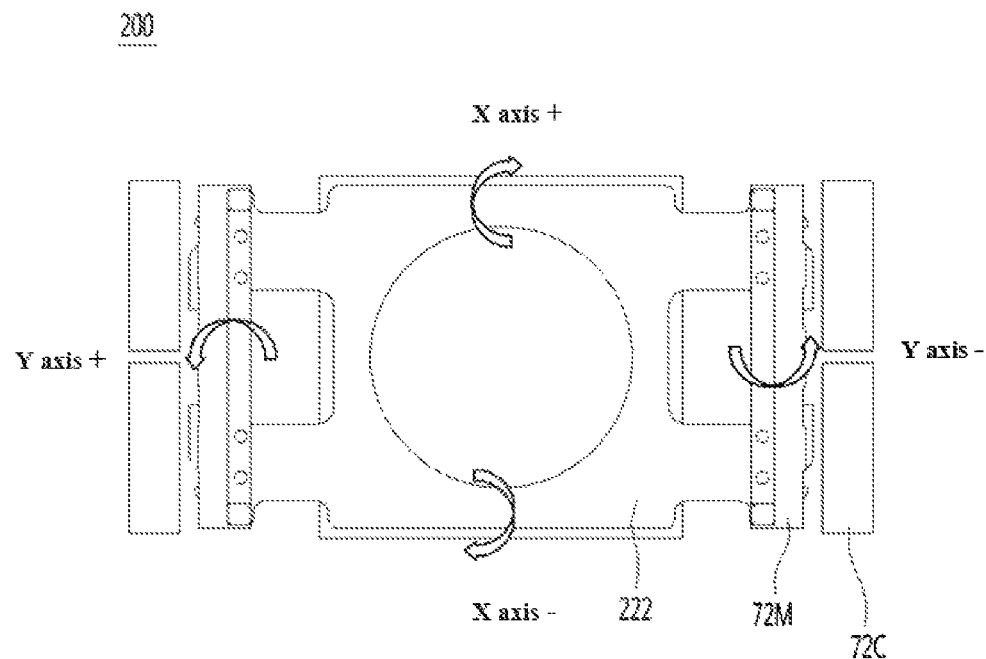

[FIG. 25a]
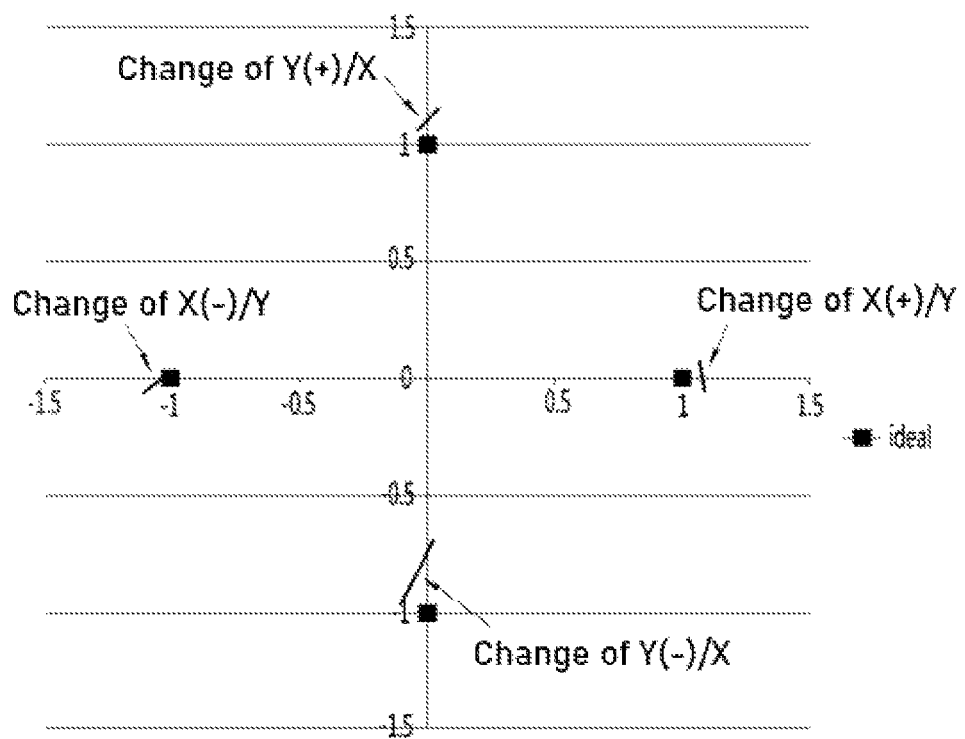

[FIG. 25b]
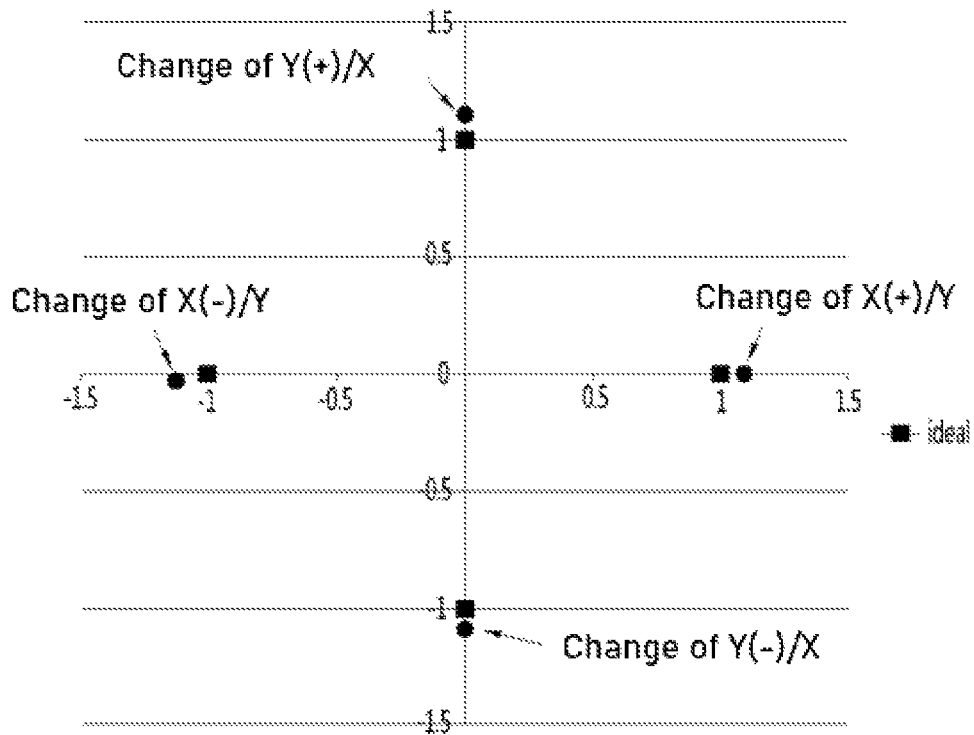
[FIG. 26a]
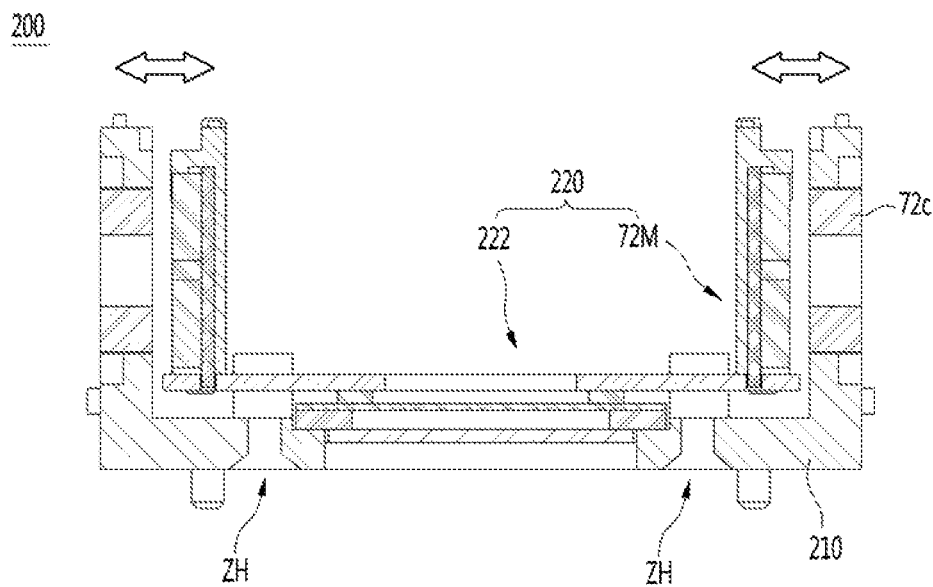

[FIG. 26b]
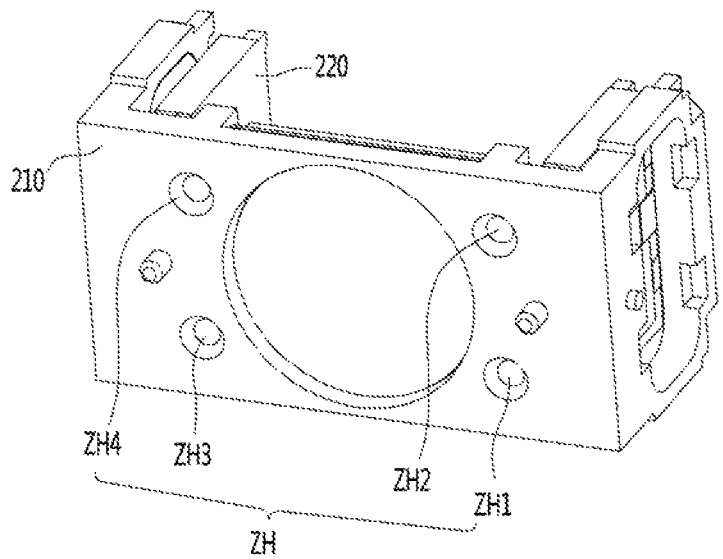
[FIG. 27]
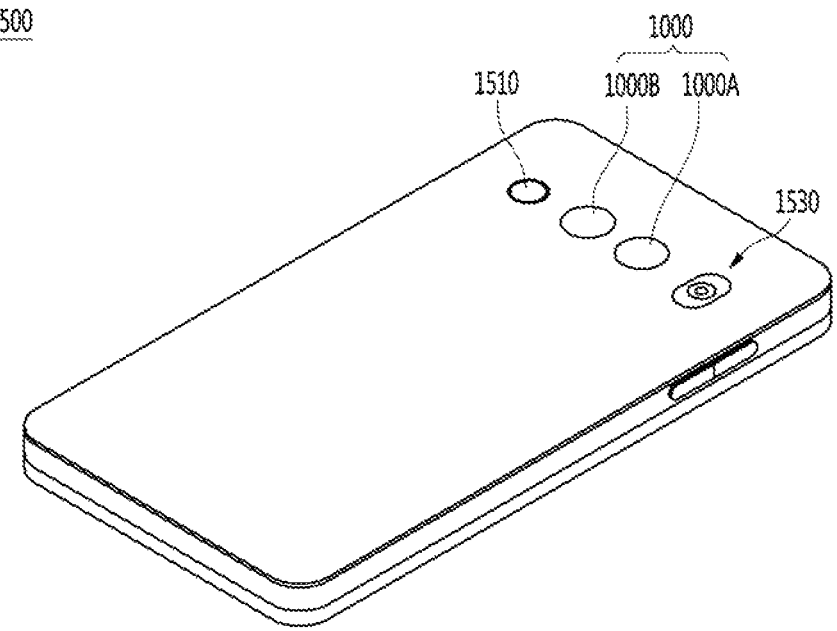

CAMERA MODULE

CROSS REFERENCE TO RELATED APPLICATIONS

This application is the National Phase of PCT International Application No. PCT/KR2019/014618, filed on Oct. 31, 2019, which claims priority under 35 U.S.C. 119(a) to Patent Application No. 10-2018-0138617, filed in the Republic of Korea on Nov. 13, 2018, all of which are hereby expressly incorporated by reference into the present application.

TECHNICAL FIELD

The embodiment relates to an actuator and a camera module including the same.

BACKGROUND ART

The camera module performs a function of photographing a subject and storing it as an image or video, and is mounted on a mobile terminal such as a mobile phone, a laptop computer, a drone, or a vehicle.

The actuator is a product with a function that quickly focuses by moving the lens in the camera module up, down, left and right, and the issue of ultra-slim or ultra-thin, low power consumption, and low cost are major technical issues in actuators.

Such a camera module is applied as a mobile camera module or a vehicle camera module.

The mobile camera module is an essential component for taking and storing photos in mobile devices such as smart phones and tablet PCs. This mobile camera module converts light entering the lens into an electrical signal using an image sensor, and outputs it to the device display through software, and allows the user to enjoy and store it.

In addition, the mobile camera module can operate digital devices by detecting the movement of objects such as facial expressions and hand movements of a person, which is a subject, and is expanding its application area as an input device.

In such a mobile camera module, there are technical issues of implementing high-performance modules such as image stabilization or wide-angle optical systems, as well as ultra-micro and ultra-thin issues.

Next, the vehicle camera module is a product for transmitting images around the vehicle or inside the vehicle to the display, and can be mainly used for parking assistance and driving assistance systems.

In addition, the vehicle camera module detects lanes and vehicles around the vehicle, collects and transmits related data, so that the ECU can give a warning or control the vehicle.

On the other hand, portable devices such as smartphones, tablet PCs, and laptops have built-in micro-mobile camera modules, and these mobile camera modules automatically adjust the distance between the image sensor and the lens to align the focal length of the lens such that an autofocus function can be performed.

Recently, a camera module may perform a zooming function of zooming up or zooming out of photographing by increasing or decreasing the magnification of a distant subject through a zoom lens.

In addition, a recent camera module employs an image stabilization (IS) technology to correct or prevent image shake caused by an unstable fixing device or a camera movement caused by a user's movement. These IS technologies include Optical Image Stabilizer (OIS) technology and anti-shake technology using an image sensor.

OIS technology is a technology that corrects motion by changing the path of light, and the anti-shake technology using an image sensor is a technology that corrects movement in a mechanical and electronic manner, and OIS technology is more widely adopted.

On the other hand, the image sensor increases the resolution as it becomes a higher pixel, so that the size of the pixel decreases. However, when the pixel becomes smaller, the amount of light received at the same time decreases. Therefore, in a dark environment, the higher the pixel camera, the more severe the blurring of the image due to hand shake appears as the shutter speed becomes slower.

Accordingly, in order to capture an image without distortion using a high-pixel camera in a dark night or video, the OIS function is recently adopted indispensably.

On the other hand, OIS technology is a method of correcting the image quality by correcting the optical path by moving the lens or image sensor of the camera. In particular, the OIS technology detects the movement of the camera through a gyro sensor and calculates the distance for the image sensor to move.

For example, the OIS correction method includes a lens shift method and a module tilting method. The lens shift method moves only the lens in the camera module to rearrange the center of the image sensor and the optical axis. On the other hand, the module tilting method moves the entire module including the lens and image sensor.

In particular, the module tilting method has a wider correction range than the lens shift method, and since the focal length between the lens and the image sensor is fixed, it has the advantage of minimizing image deformation.

Meanwhile, in the case of the lens shift method, a Hall sensor is used to detect the position and movement of the lens. On the other hand, in the module tilting method, a photo reflector is used to detect the movement of the module. However, both methods use a gyro sensor to detect the movement of the camera user.

The OIS controller uses the data recognized by the gyro sensor to predict where the lens or module should move to compensate for the user's movement.

FIG. 1 is a view showing a camera module 10 according to the related art.

The camera module 10 employing the related OIS technology has a complex structure because a lens unit 12 is mounted in the actuator 11 and a mechanical driving device is required for lens movement or tilting of the module.

In addition, in the related art, since the driving element 16 or the gyro sensor 15 must be mounted on the circuit board 13, there is a limit to implementing a micro camera module.

In particular, as shown in FIG. 1, in the camera module 10 structure employing the related OIS technology, the gyro sensor 15 or the driving element 16 is arranged in the horizontal direction of the camera module 10, so that the size of the entire camera module is increased, and it is difficult to implement a micro-camera module.

In addition, in the related art, the circuit board 13 includes a flexible printed circuit board 13a and a rigid printed circuit board 13b, and the gyro sensor 15 is disposed on the rigid printed circuit board (PCB) 31b. However, in order to increase the precision of data in OIS driving, a precise leveling of the gyro sensor is important, but there is a problem that it is difficult to reach the required level of precision.

In addition, according to the related art, as the gyro sensor is disposed to be spaced apart from the camera module 10, it is difficult to accurately detect the degree of movement of the camera module according to the movement of the user. For example, when the camera module 10 is rotated around the gyro sensor 15 by the user, the degree of movement of the gyro sensor 15 and the actuator 11 or the lens unit 12 are moved such that there is a problem that the accuracy of the angular acceleration data is deteriorated due to a large difference in accuracy.

In addition, according to the recent technological trend, ultra-slim and micro-miniature camera modules are required. In the micro-camera module, there is a problem in that it is difficult to implement OIS functions applied to general large cameras due to space constraints for OIS operation. So, there is a problem in not being able to implement a very micro camera module.

In addition, in the related OIS technology, as the OIS driver is disposed on the side of the solid lens assembly within the limited size of the camera module, there is a problem in that it is difficult to secure the amount of light because the size of the lens for OIS is limited.

In particular, in order to achieve the best optical characteristics in a camera module, alignment between lens groups must be well matched when implementing OIS through lens movement or tilting of the module. However, in the related OIS technology, a decent, in which the spherical center between lens groups deviates from the optical axis, or a tilt, which is a lens inclination phenomenon, occurs such that there is a problem that the angle of view is changed or out of focus occurs, which adversely affects image quality or resolution.

In addition, in the related OIS technology, it is possible to implement AF or Zoom simultaneously with OIS driving. However, due to the space constraints of the camera module and the location of the driving part of the existing OIS technology, the magnet for OIS and the magnet for AF or Zoom are placed close together, causing magnetic field interference such that there is a problem that the OIS is not properly driven, causing a decent or a tilt phenomenon.

In addition, the related OIS technology requires a mechanical driving device for lens movement or tilting of the module, so that the structure is complex and power consumption is increased.

DISCLOSURE

Technical Problem

One of the technical problems of the embodiment is to provide an ultra-small, ultra-slim actuator and a camera module including the same.

In addition, one of the technical problems of the embodiment is to provide an actuator and a camera module including the same, capable of securing high precision of the gyro sensor by securing a high precise leveling of the gyro sensor.

In addition, one of the technical problems of the embodiment is, in relation to the arrangement of the gyro sensor of the camera module, to improve the precision of each acceleration and also reducing the error rate due to temperature drift by placing the gyro sensor close to the camera module such that it is intended to provide an actuator and a camera module including the same capable of remarkably improving the precision of a gyro sensor.

In addition, one of the technical problems of the embodiment is to provide an actuator and a camera module including the same so that a sufficient amount of light can be secured by solving the size limitation of the lens in the lens assembly of the optical system when implementing the OIS.

In addition, one of the technical problems of the embodiment is to provide an actuator, and a camera module including the same, capable of exhibiting the best optical characteristics by minimizing the occurrence of decent or tilt when implementing OIS.

In addition, one of the technical problems of the embodiment is to provide an actuator, and a camera module including the same, capable of preventing magnetic field interference with a magnet for AF or Zoom when implementing OIS.

In addition, one of the technical problems of the embodiment is to provide an actuator and a camera module including the same, capable of implementing OIS with low power consumption.

The technical problem of the embodiment is not limited to the content described in this item, and includes what can be understood from the description of the invention.

Technical Solution

The actuator according to the embodiment includes a first circuit board 414 on which an image sensor is disposed, a first housing 20 disposed on the first circuit board, a lens assembly disposed in the first housing, and a second circuit board 412 on which a gyro sensor is disposed and disposed on the first side portion 22a of the first housing and a third circuit board 413 disposed on the first side portion 22a of the first housing and having a first region in which a first coil 142b driving the lens assembly is disposed. The first coil 142b may overlap with the second circuit board 412 in a direction perpendicular to the optical axis direction.

The embodiment may include a fourth circuit board 411 connected to the second circuit board and on which a connector is disposed.

The third circuit board 413 may be disposed on the third side portion 22c of the first housing and the third circuit board 413 may include a third region 413c in which a second coil 412a is disposed and a second region 413b disposed on a second side portion 22b connected between the first side portion and the third side portion of the first housing.

The first side portion 22a of the first housing includes a first end 22a1 on which the second circuit board 412 is disposed and a second end 22a2 on which the first region of the third circuit board is disposed. And a step 22as may be formed by the first end and the second end.

The first side portion of the first housing may include a hole 22ah, and the first coil 142b may be inserted into the hole 22ah.

The embodiment includes a shield cover in which the first housing is disposed, and the shield cover may have a groove in which the gyro sensor is disposed.

The embodiment may include a second housing disposed on the first housing, a prism disposed on the second housing, and an OIS unit disposed between the housing and the prism.

The embodiment may include a fifth circuit board on which a third coil driving the OIS unit is disposed, and on which the first housing and the second housing are disposed, and the fifth circuit board is connected with the second circuit board.

The OIS unit may include a lens unit, a shaper unit, and a magnet coupled to the shaper unit and driving the lens unit.

The second housing may include a second hole, and the third coil may be inserted into the second hole.

The fifth circuit board may include a region disposed between the second side portion of the first housing and a fourth side portion facing the second side portion, and a region disposed on two sides portions of the second housing.

The second housing may have a third hole in which a part of the lens unit is disposed.

The image sensor, the lens assembly, the lens unit, and the prism may overlap in the optical axis direction.

In addition, the actuator according to the embodiment includes a first housing 20 accommodating a lens assembly, a second circuit board 412 disposed on a sidewall of the first housing 20, and a gyro sensor 151 disposed in the second circuit board 412.

The second circuit board 412 may be disposed extending in a vertical axis direction in a horizontal coordinate plane perpendicular to the optical axis.

In addition, the actuator according to the embodiment may further include a shield cover 510 on an outer surface of the first housing 20.

The shield cover 510 may include a predetermined support bracket 513, and may include a guide groove 513R in which the second circuit board 412 is disposed in the support bracket 513.

As the second circuit board 412 is fixedly disposed in the guide groove 513R of the support bracket 513, the precise leveling of the gyro sensor 151 may be secured within 1°.

The embodiment further includes a second actuator disposed on one side of the actuator, the actuator may be an AF or zoom actuator, and the second actuator may be an OIS actuator.

The gyro sensor 151 may be spaced apart from the second actuator and disposed perpendicularly to a side surface of the actuator.

In addition, the actuator according to the embodiment may include a first actuator 100 that functions as a zooming function, and a second actuator 200 that is disposed on one side of the first actuator 100 and functions as an OIS.

The second actuator 200 includes a second housing 210, an OIS unit 220 disposed on the second housing 210, including a shaper unit 222 and a first driving unit 72M, and a second driving unit 72C disposed on the second housing 210.

The shaper unit 222 includes a shaper body 222a, a protrusion 222b extending laterally from the shaper body 222a and coupled to the first driving unit 72M, and a lens unit 222c disposed on the shaper body 222a.

The lens unit 222c may also function as a prism for changing a path of light.

The second actuator 200 may include a prism unit 230 disposed on the OIS unit 220.

The lens unit 222c of the second actuator 200 may include a light-transmitting support part 222c2, a light-transmitting support part 222c2, a second light-transmitting support part (not shown), a variable prism or a liquid lens.

In an embodiment, the first driving unit 72M of the second actuator 200 includes a magnet coupled to the protrusion 222, and the second driving unit 72C may include a coil coupled to the shaper body 222a.

The protrusion 222 of the second actuator 200 may include a first protrusion 222b1 and a second protrusion 222b2 respectively extending from the shaper body 222a to one side.

The first support part b1e, which is the end of the first protrusion 222b1, and the second support part b2e, which is the end of the second protrusion 222b2 may be spaced apart from each other.

The camera module according to the embodiment may include an image sensor unit and the actuator disposed at one side of the image sensor unit.

Advantageous Effects

The embodiment has a technical effect capable of providing a micro-miniature, ultra-thin actuator and a camera module including the same. For example, according to the embodiment, the size of the actuator can be reduced by arranging the gyro sensor 151 on a circuit board disposed perpendicular to the horizontal coordinate axis (x-axis) direction and extending in a horizontal direction to the optical axis (z-axis) direction. By controlling the size at the level of the horizontal width of the first housing, it is possible to implement an ultra-small and ultra-thin actuator and a camera module including the same.

For example, in the related internal technology, a gyro sensor was disposed on a circuit board extending from the actuator in the horizontal coordinate axis (x-axis) direction, and the horizontal width of the circuit board reached about 3 to 4 mm. Since the horizontal area of about 25% or more can be reduced by reducing the horizontal width of the circuit board, there is a technical effect of implementing a micro-miniature, ultra-thin actuator and a camera module including the same.

In addition, according to the embodiment, as the circuit board on which the gyro sensor 151 is disposed in the guide groove 513R of the support bracket 513 can be firmly fixed and disposed, the precise leveling of the gyro sensor 151 can be secured to a high level of the gyro sensor. There is a complex technical effect that can provide a micro actuator and a camera module including the same while securing precision.

For example, in the camera module of the embodiment, the support bracket 513 is provided on the shield cover 510, and the support bracket 513 includes a guide groove 513R in which a circuit board is disposed, thereby guiding the support bracket 513. As the circuit board is firmly fixed and disposed in the groove 513R, there is a special technical effect that can provide a micro-actuator and a camera module including the same as well as a special technical effect that can secure a high precise leveling of the gyro sensor 151.

In addition, in relation to the arrangement of the gyro sensor of the camera module, the gyro sensor 151 can be placed close to the camera module to improve the accuracy of each acceleration and at the same time improve the accuracy of the gyro sensor by reducing the error rate due to temperature drift such that there is a complex technical effect that can significantly improve the accuracy of the gyro sensor and also provide a micro camera module.

For example, in the embodiment, a support bracket 513 may be provided on the shield cover 510, and the support bracket 513 may include a guide groove 513R in which a circuit board is disposed. Accordingly, the circuit board may be firmly fixedly disposed in the guide groove 513R of the support bracket 513, and the gyro sensor 151 may be disposed close to the camera module. Accordingly, the accuracy of the angular acceleration of the gyro sensor can be improved, and the error rate due to temperature drift can be reduced by disposing the gyro sensor away from the image sensor that generates a lot of heat. Accordingly, there is a complex technical effect capable of providing a micro-camera module while remarkably improving the precision of the gyro sensor.

Meanwhile, in the related art, as the gyro sensor is disposed apart from the lens unit, there is a technical problem in that an error occurs between the movement degree of the lens unit and the movement degree sensed by the gyro sensor according to the user's movement. For example, when the camera module rotates around the gyro sensor, the difference between the degree of movement of the gyro sensor and the degree of movement of the lens unit becomes large, resulting in a problem in that the accuracy of the angular acceleration data is degraded.

However, in the embodiment, as the gyro sensor is closely disposed on the side of the first housing in which the lens unit is disposed, the degree of movement of the lens unit according to the user's movement and the error in movement information detected by the gyro sensor are significantly reduced such that there is a special technical effect that can greatly improve the precision of the angular acceleration of the gyro sensor.

In addition, according to the embodiment, in addition to the shielding effect of the shield cover 510, there is a complex technical effect of shielding EMI, EMC, etc. by the support bracket 513.

In addition, the actuator and camera module according to the embodiment may solve the problem of lens decenter or tilt during zooming such that there is a technical effect of remarkably improving the image quality or resolution by preventing the occurrence of defocusing or changing the angle of view by matching the alignment between the plurality of lens groups.

In addition, according to the embodiment, there is a technical effect capable of solving the problem of generating friction torque during zooming. For example, according to the embodiment, by removing the area other than the first pin guide and the second pin guide from the upper region of the first driving housing where the first guide pin is located, friction is reduced by reducing the weight of the first driving housing. By reducing the torque and reducing the frictional resistance, there are technical effects such as improvement of driving force during zooming, reduction of power consumption, and improvement of control characteristics.

Accordingly, according to the embodiment, there is a complex technical effect that can significantly improve image quality or resolution by preventing the occurrence of decent or tilt of the lens while minimizing friction torque during zooming.

In addition, according to the embodiment, there is a technical effect that the zooming function can be smoothly performed even in a compact camera module. For example, according to the embodiment, there is a technical effect that a compact camera module can be implemented by arranging the Hall sensor in the inner area of the first coil to reduce the area occupied by the Hall sensor.

In addition, according to the embodiment, there is a technical effect of providing an ultra-slim, ultra-miniature actuator, and a camera module including the same.

For example, according to the embodiment, there is a technical effect of providing an ultra-slim, ultra-miniature actuator and a camera module including the OIS unit 220 by utilizing the space under the prism unit 230 and arranging to overlap each other.

In addition, according to the embodiment, there is a technical effect of providing an actuator and a camera module including the same, capable of securing a sufficient amount of light by removing a size limitation of a lens in a lens assembly of an optical system when implementing OIS.

For example, according to an embodiment, by arranging the OIS unit 220 under the prism unit 230, there is a technical effect that can provide an actuator and a camera module including the same, capable of securing a sufficient amount of light by removing the size limitation of the lens in the lens assembly of the optical system when implementing OIS.

In addition, according to the embodiment, there is a technical effect of providing an actuator, and a camera module including the same, capable of exhibiting the best optical characteristics by minimizing the occurrence of a decent or a tilt phenomenon when implementing an OIS.

For example, the embodiment can include an OIS unit 220 stably disposed on the second housing 210*a* and in the embodiment, OIS may be implemented through the lens unit 222*c* having the variable prism 222*cp* using the shaper unit 222 and the first driving unit 72M. Accordingly, there is a technical effect of providing an actuator and a camera module including the same, capable of exhibiting the best optical characteristics by minimizing the occurrence of a decent or a tilt phenomenon.

In addition, according to the embodiment, there is a technical effect of providing an actuator and a camera module including the same, capable of preventing magnetic field interference with an AF or zoom magnet when implementing OIS.

For example, according to an embodiment, when OIS is implemented, a first driving unit 72M, which is a magnet driving unit, may be disposed in the second actuator 200 separated from the first actuator 100 such that there is a technical effect of providing an actuator and a camera module including the same, capable of preventing magnetic field interference with an AF or a zoom magnet of the first actuator 100.

In addition, according to the embodiment, there is a technical effect of providing an actuator and a camera module including the same, capable of implementing OIS with low power consumption.

For example, unlike moving a plurality of conventional solid lenses, in an embodiment, the first driving unit 72M as a magnet driving unit and the second driving unit 72C as the coil driving unit can drive the shaper unit 222 to drive the lens unit 222*c* including the variable prism to implement OIS. Accordingly, there is a technical effect of providing an actuator and a camera module including the same, capable of implementing OIS with low power consumption.

In addition, according to the embodiment, since the prism unit 230 and the lens unit 222*c* including the variable prism can be arranged very close, even if the optical path change is finely performed in the lens unit 222*c*, there is a special technical effect in that the optical path change can be widened in the actual image sensor unit.

For example, according to the embodiment, the lens unit 222*c* including the variable prism may be disposed very close to the fixed prism 232. Meanwhile, a distance between the lens unit 222*c* and the image plane 190P of the first lens assembly (not shown) may be secured relatively far. Accordingly, in the variable prism 222*cp*, the first distance D1δ reflected on the image plane 190P can be secured widely according to the change in the slope of the predetermined angle Θ. Therefore, even if the optical path change is finely performed in the lens unit 222*c*, there is a special technical effect of ensuring a wide range of optical path changes in the actual image sensor unit.

In addition, according to the embodiment, the first protrusion 222*b*1 and the second protrusion 222*b*2 of the shaper unit 222 may be spaced apart, and the third protrusion 222*b*3 and the fourth protrusion 222*b*4 may be spaced apart from each other. Accordingly, when the x-axis or y-axis of each protrusion portion is moved, other protrusions may be less affected. Therefore, there is an effect of improving performance by remarkably reducing the amount of error change generated compared to the target value (ideal) when driving in each axial direction (see FIG. 22).

In addition, in an embodiment, the second housing 210 may include a jig hole ZH, and the assembly process of the second actuator 200 may be performed while a predetermined jig is firmly coupled to the jig hole ZH of the second housing 210. At this time, the jig may pass through the jig hole ZH and be led out to the upper side of the second housing 210, and the shaper unit 222 may be firmly disposed on the protruding jig. The first to fourth jigs may be disposed to overlap first to fourth protrusions 222b1, 222b2, 222b3, 222b4 of the shaper body in a vertical direction. Thereafter, the first driving unit 72M, the second driving unit 72C, and the like may be firmly coupled to the shaper unit 222, and there is a special technical effect that can significantly prevent the occurrence of tilt (see FIG. 26B).

The technical effect of the embodiment is not limited to the content described in this item, and includes what is understood from the description of the invention.

DESCRIPTION OF DRAWINGS

FIG. 1 is a view showing a camera module according to the related art.

FIG. 2 is a perspective view showing the camera module of the embodiment.

FIG. 3A is a perspective view of a shield removed from the camera module of the embodiment shown in FIG. 2.

FIG. 3B is a plan view of the camera module of the embodiment shown in FIG. 3A.

FIG. 4A is a perspective view of the first actuator of the embodiment shown in FIG. 3A in a first direction.

FIG. 4B is a perspective view of a first housing in which a portion of the first housing is removed from the first actuator of the embodiment shown in FIG. 4A.

FIG. 5A is a perspective view of the first actuator of the embodiment shown in FIG. 4A in a second direction.

FIG. 5B is an exploded perspective view of the first actuator of the embodiment shown in FIG. 5A.

FIG. 6 is a perspective view in which the first housing body, the first cover, and the second cover are removed from the first actuator in the embodiment shown in FIG. 5A.

FIG. 7 is a perspective view of a first lens assembly and a first driving unit in the first actuator in the embodiment shown in FIG. 6.

FIG. 8 is an exemplary diagram illustrating an interaction between a first magnet and a first coil part in the first actuator in the embodiment shown in FIG. 7.

FIG. 9 is a partial perspective view of the first actuator shown in FIG. 7.

FIG. 10 is a graph showing Hall sensor linearity according to a stroke in the first actuator shown in FIG. 9;

FIG. 11A is a detailed perspective view of a first actuator in the camera module of the embodiment shown in FIG. 3A.

FIG. 11B is a plan view of the first actuator of the embodiment shown in FIG. 11A.

FIG. 11C is a perspective view of the camera module of the embodiment shown in FIG. 11A in which the first housing is removed from the first actuator.

FIG. 11D is a bottom view of a perspective view in which the first housing is removed from the first actuator in the camera module of the embodiment shown in FIG. 11C.

FIG. 11E is a perspective view of a first housing in a first actuator in the camera module of the embodiment shown in FIG. 11A.

FIG. 12A is a perspective view of a shield can in the camera module of the embodiment shown in FIG. 2.

FIG. 12B is a bottom perspective view of a shield can in the camera module of the embodiment shown in FIG. 12A.

FIG. 13 is a partially enlarged view of a shield can in the camera module of the embodiment shown in FIG. 12B.

FIG. 14A is a perspective view of a second actuator in a first direction in the camera module of the embodiment shown in FIG. 3A.

FIG. 14B is a perspective view of a second actuator in a second direction in the camera module of the embodiment shown in FIG. 3A.

FIG. 15 is a perspective view of a first circuit board and a coil part of the second actuator of the embodiment shown in FIG. 14B.

FIG. 16A is a partially exploded perspective view of the second actuator of the embodiment shown in FIG. 14B.

FIG. 16B is a perspective view of the first circuit board removed from the second actuator of the embodiment shown in FIG. 14B.

FIG. 17A is an exploded perspective view of the image shaking control unit of the second actuator of the embodiment shown in FIG. 16A.

FIG. 17B is a combined perspective view of the image shaking control unit of the second actuator of the embodiment shown in FIG. 17A.

FIG. 17C is an exploded perspective view of a first driving unit in the image shake control unit shown in FIG. 17A.

FIG. 18 is a perspective view of a shaper unit of the second actuator of the embodiment shown in FIG. 17A.

FIG. 19 is a cross-sectional view of the lens unit along the line A1-A1' of the shaper unit shown in FIG. 18;

FIGS. 20A to 20B are diagrams illustrating the operation of the second actuator according to the embodiment.

FIG. 21A is a diagram illustrating a first operation of the second actuator of the embodiment.

FIG. 21B is an exemplary view of a second operation of the second actuator of the embodiment.

FIG. 22 is a perspective view of a first shaper unit of the second actuator of the embodiment.

FIG. 23 is a perspective view of a second shaper unit of the second actuator of the embodiment.

FIG. 24 is a diagram illustrating a third operation of the second actuator according to the embodiment.

FIG. 25A is a characteristic of a change amount when a second shaper unit of a second actuator is implemented according to an embodiment.

FIG. 25B is a characteristic of a change amount when a first shaper unit of a second actuator is implemented according to an embodiment.

FIG. 26A is a first cross-sectional view of a second actuator according to an embodiment.

FIG. 26B is a bottom view of a second actuator according to the embodiment.

FIG. 27 is a perspective view of a mobile terminal to which a camera module according to an embodiment is applied.

MODE FOR INVENTION

Hereinafter, embodiments will be described in detail with reference to the accompanying drawings. Since the embodiments can be modified in various ways and have various forms, specific embodiments will be illustrated in the drawings and described in detail in the text. However, this is not intended to limit the embodiments to a specific form of disclosure, it should be understood to include all changes, equivalents, or substitutes included in the spirit and scope of the embodiments.

Terms such as "first" and "second" may be used to describe various elements, but the elements should not be limited by the terms. These terms are used for the purpose of distinguishing one component from another component. In addition, terms specifically defined in consideration of the configuration and operation of the embodiment are only for describing the embodiment, and do not limit the scope of the embodiment.

In the description of the embodiment, in the case of being described as being formed on the "up (on)" or "down (under)" of each element, the up (on) or down (under) includes both elements in direct contact with each other or in which one or more other elements are indirectly formed between the two elements. In addition, when expressed as "up (on)" or "down(under)", the meaning of not only an upward direction but also a downward direction based on one element may be included.

In addition, relational terms such as "top/upper/above" and "bottom/lower/below" used below do not necessarily require or imply any physical or logical relationship or order between such entities or elements, it may be used to distinguish one entity or element from another entity or element.

First Embodiment

FIG. 2 is a perspective view showing the camera module 1000 of the embodiment, FIG. 3A is a perspective view of the camera module 1000 of the embodiment shown in FIG. 2 with the shield cover 510 removed, and FIG. 3B is a plan view of the camera module 1000 of the embodiment shown in FIG. 3A.

Referring to FIG. 2, the camera module 1000 of the embodiment may include a single or a plurality of camera modules. For example, the embodiment may include a first camera module 1000A and a second camera module 1000B. The first camera module 1000A and the second camera module 1000B may be covered by a predetermined shield cover 510.

Referring to FIGS. 2, 3A, and 3B together, in an embodiment, the first camera module 1000A may include a single actuator or a plurality of actuators. For example, the first camera module 1000A according to the embodiment may include a first actuator 100 and a second actuator 200.

The first actuator 100 may be electrically connected to the first group of circuit board 410, and the second actuator 200 may be electrically connected to the second group of circuit board 420. The second camera module 1000B may be electrically connected to the third group of circuit board 430.

The first actuator 100 may be a zoom actuator or an auto focus (AF) actuator, and may be electrically connected to the first group of circuit boards 410. For example, the first actuator 100 may support one or a plurality of lenses through a predetermined driving unit and may perform an auto focusing function or a zoom function by moving the lenses up and down in response to a control signal from a predetermined controller.

The second actuator 200 may be an OIS (Optical Image Stabilizer) actuator, and may be electrically connected to the second group of circuit boards 420. The second group of circuit boards 420 may be electrically connected to the first group of circuit boards 410.

Meanwhile, the second camera module 1000B may have a fixed focal length lens disposed in a predetermined barrel (not shown), and may be electrically connected to the third group of circuit board 430. The fixed focal length lenses may be referred to as "single focal length lenses" or "single lens".

In the second camera module 1000B, an actuator (not shown) capable of driving a lens unit may be disposed in a predetermined housing (not shown). The actuator may be a voice coil motor, a micro actuator, a silicon actuator, or the like, and may be applied in various ways, such as an electrostatic method, a thermal method, a bimorph method, and an electrostatic force method, but is not limited thereto.

Hereinafter, the characteristics of the first actuator 100 according to the embodiment will be described in detail with reference to the drawings of FIGS. 4A to 11B, and the characteristics of the second actuator 200 will be described with reference to FIG. 14A and the following drawings.

First, FIG. 4A is a perspective view of the first actuator 100 in the first direction of the embodiment shown in FIG. 3A, and FIG. 4B is a perspective view of the first actuator 100 of the embodiment shown in FIG. 4A with a part of the first housing 20 removed therefrom.

In addition, FIG. 5A is a perspective view of the first actuator 100 of the embodiment shown in FIG. 4A in a second direction, and FIG. 5B is an exploded perspective view of the first actuator 100 of the embodiment shown in FIG. 5A.

For example, FIG. 4A is a front perspective view of the device unit 150 including the gyro sensor 151 in the first actuator 100 and FIG. 5A is a perspective view of the first actuator 100 in which the gyro sensor 151 is disposed on the rear surface.

In the xyz axis direction shown in FIGS. 4A, 4B, 5A, and 5B, the z-axis refers to the optical axis direction or a direction parallel thereto, the xz plane refers to the ground, and the x-axis refers to the ground (xz plane). It means a direction perpendicular to the z-axis, and the y-axis may mean a direction perpendicular to the ground.

Referring to FIGS. 4A and 4B, in the camera module of the embodiment, the first actuator 100 includes a first housing 20, a first group of circuit boards 410 and a device unit 150 disposed outside the first housing 20.

The first housing 20 may include a first housing body 22, a first cover 21 disposed on one side of the first housing body 22, and a second cover 22 disposed on the other side.

The material of the first housing 20 may be formed of at least one of plastic, glass-based epoxy, polycarbonate, metal, or composite material.

In the embodiment, the first housing 20 may be designed as a master barrel structure that surrounds the entire zoom module to prevent outer material, block light, fix pins, and fix the lens, but is not limited thereto. The first cover 21 and the second cover 22 may be fitted in shape with the first housing body 22 and may be coupled by means of an adhesive.

Referring to FIGS. 4A and 4B, the first group of circuit boards 410 may include a single or a plurality of circuit boards. For example, the first group of circuit boards 410 may include a fourth circuit board 411, a second circuit board 412, a third circuit board 413, and a first circuit board 414.

The second circuit board 412 is electrically connected to the fourth circuit board 411, and a gyro sensor 151 for detecting movement, a first electronic device 152, and a second electronic device 153 are disposed on the second circuit board 412. The first electronic device 152 may be a driver IC, and the second electronic device 153 may be an EEPROM, but is not limited thereto.

The third circuit board 413 may be electrically connected to a driving unit driving the lens unit, and an image sensor 190 (refer to FIG. 4B) may be disposed on the first circuit board 414.

Next, referring to FIG. 4B, various optical systems such as a first lens assembly 110, a second lens assembly 120, and a third lens group 130 may be disposed on the first housing body 22. A first side surface of the first housing body 20 in the direction of the optical axis may be coupled to the first cover 21, and the other side may be coupled to the second cover 22. A predetermined image sensor unit 190 may be disposed in the direction of the second cover 22.

Next, referring to FIG. 5B, in an embodiment, the first cover 21 and the second cover 22 may be coupled to the guide pin 50. For example, the guide pin 50 may include a first guide pin 51 and a second guide pin 52 disposed to be spaced apart parallel to the optical axis. One end of the first guide pin 51 and the second guide pin 52 may be fixed by being coupled to the first cover 21 and the other end of the second cover 22.

In an embodiment, the first cover 21 may include a first hook (not shown), and a second hook (not shown) protruding from the first cover body in the direction of the first housing body 22 and being disposed in a diagonal direction.

In addition, the first housing body 22 may include a first hook coupling portion 26a1 and a second hook coupling portion 26a2 at positions corresponding to the first hook and the second hook and a first hole 26h1 and a second hole 26h2 may be disposed in each of the first hook coupling portion 26a1 and the second hook coupling portion 26a2.

The first hook and the second hook of the first cover 21 may be coupled to the first hole 26h1 and the second hole 26h2 of the first housing body 22, respectively. In addition, the first cover 21 may be stably coupled to the first housing body 22 using an adhesive.

In addition, the first cover 21 includes a first pin coupling portion (not shown) and a second pin coupling portion (not shown) coupled to the first guide pin 51 and the second guide pin 52, respectively. The first guide pin 51 and the second guide pin 52 may be inserted and coupled, respectively.

In addition, a third lens group 130 may be disposed on the first cover 21. The third lens group 130 may be a fixed lens, but is not limited thereto.

A first lens assembly 110 and a second lens assembly (refer to FIG. 6) may be disposed inside the first housing body 22.

According to an embodiment, a bottom groove (not shown) in which the first lens assembly 110 and the second lens assembly 120 move can be formed parallel to the optical axis z direction on the bottom surface of the first housing body 22. The bottom groove may have a downward concave shape according to the outer circumference shape of the lens, but is not limited thereto.

With continued reference to FIG. 5B, in an embodiment, a third driving part 141 and a fourth driving part 142 (see FIG. 6) may be disposed on both sides of the body 20 of the first housing.

Next, FIG. 6 is a perspective view showing the first actuator 100 in the embodiment shown in FIG. 5A while the first housing body 22, the first cover 21, and the second cover 22 are removed therefrom, and the lens itself is omitted.

Referring to FIGS. 6 and 5A together, in an embodiment, an optical system and a lens driver may be disposed on the first housing body 22 of the first actuator 100. For example, in the embodiment, the first actuator 100 includes at least one or more of a first lens assembly 110, a second lens assembly 120, a third lens group 130, and a guide pin 50 in the first housing body 22. The third driving unit 141 and the fourth driving unit 142 may be disposed outside the first housing body 22, thereby performing a high magnification zooming function.

Meanwhile, the first lens assembly 110, the second lens assembly 120, the third lens group 130, and the image sensor unit may be classified as optical systems.

In addition, the third driving unit 141, the fourth driving unit 142, and the guide pin 50 may be classified as a lens driving unit, and the first lens assembly 110 and the second lens assembly 120 also function as a lens driving unit. The third driving unit 141 and the fourth driving unit 142 may be driving units including a coil and a yoke, but are not limited thereto.

Referring to FIG. 6, the guide pin 50 may perform a guide function of a lens assembly to be moved, and may be provided in a single or plural number. For example, the guide pin 50 may include a first guide pin 51 and a second guide pin 52, but is not limited thereto. The guide pin 50 may be referred to as a rod or a shaft, but is not limited thereto.

In an embodiment, a predetermined prism may be disposed on the side of the third lens group 130, and a predetermined image sensor unit 190 may be disposed on the side of the second cover 22. The prism may also be included in the optical system.

In an embodiment, the prism may change incident light into parallel light. For example, the prism may change the incident light into parallel light by changing the optical path of the incident light to an optical axis (z-axis) parallel to the central axis of the lens group. Thereafter, the parallel light passes through the third lens group 130, the first lens assembly 110, and the second lens assembly 120 and enters the image sensor unit 190 to capture an image.

The prism may be an optical member having a triangular column shape. In addition, the embodiment may employ a reflector or a reflective mirror instead of or in addition to a prism.

In addition, in the embodiment, when the image sensor unit 190 is not disposed in a direction perpendicular to the optical axis, an additional prism (not shown) may be provided so that light that has passed through the lens group is captured by the image sensor unit.

In an embodiment, the image sensor unit 190 may be disposed perpendicular to the optical axis direction of parallel light. The image sensor unit may include a solid-state imaging device disposed on a predetermined first circuit board 414. For example, the image sensor unit 190 may include a Charge Coupled Device (CCD) image sensor or a Complementary Metal-Oxide-Semiconductor (CMOS) image sensor.

In the following description of the embodiment, a case of two moving lens groups is described, but is not limited thereto, and there may be three, four, or five or more moving lens groups. In addition, the optical axis direction z may mean a direction that is the same as or parallel to the direction in which the lens groups are aligned.

With continued reference to FIGS. 5B and 6, the first actuator 100 according to the embodiment may perform a zooming function. For example, in the embodiment, the first lens assembly 110 and the second lens assembly 120 may be moving lenses that move through the third driving unit 141, the fourth driving unit 142 and the guide pin 50, and the third lens group 130 (refer to FIG. 5) may be a fixed lens, but is not limited thereto.

In this case, the third lens group 130 may perform a function of a focator for forming parallel light at a specific position.

Next, the first lens assembly 110 may perform a variable function of re-forming an image formed by the third lens group 130 as a concentrator to another location. Meanwhile, in the first lens assembly 110, the magnification change may be large due to the large change in the distance or the image distance to the subject.

On the other hand, the image point of the image in the first lens assembly 110, which is a variable factor, may be slightly different depending on the location.

Accordingly, the second lens assembly 120 may perform a position compensation function for an image formed by a variable power factor. For example, the second lens assembly 120 performs a function of a compensator that performs a role of accurately forming an image point formed in the first lens assembly 110, which is a variable factor, at the position of the actual image sensor unit.

In an embodiment, the actuator may include a mover and a fixing part. The mover is a concept corresponding to a fixed part and may be referred to as a moving part. For example, the mover may refer to the first and second lens assemblies 110 and 120 that are moved through the guide pin 50. On the other hand, the fixing part may mean the first housing 20, the guide pin 50, the third driving part 141, the fourth driving part 142, and the like that are not moved.

With continued reference to FIG. 6, in an embodiment, one or more guide pins 50 may be disposed parallel to the optical axis (z-axis). For example, the guide pin 50 may include a first guide pin 51 and a second guide pin 52 that are spaced apart from each other in parallel to the optical axis direction.

The first guide pin 51 and the second guide pin 52 are coupled to the first cover 21, the second cover 22 of the first housing (refer to FIG. 5), and may function as a movement guide of the first lens assembly 110, the second lens assembly 120. The guide pin 50 may be formed of at least one of plastic, glass-based epoxy, polycarbonate, metal, or composite material, but is not limited thereto.

Next, in the embodiment, the first lens assembly 110 and the second lens assembly 120 may be driven by electromagnetic force due to interaction with the third driving unit 141 and the fourth driving unit 142, respectively, but are not limited thereto.

The third driving unit 141 and the fourth driving unit 142 may be driving units having a coil and a yoke. For example, the third driving unit 141 may include a second yoke 141a and a second coil unit 141b, and the fourth driving unit 142 may include a first yoke 142a and a first coil unit 142b.

In addition, the first lens assembly 110 of the embodiment may include one or more of the first housing 112, the first lens group (not shown), and the first magnet 116. The first housing 112 may include a first lens housing 112a accommodating a first lens group (not shown) and a first driving unit housing 112b accommodating the first magnet 116. The lens housing may be referred to as a lens barrel, but is not limited thereto.

In addition, the first housing 112 further includes a first-second yoke (not shown) under the first magnet 116 inside the first driving unit housing 112b, so that the magnetic force of the first magnet 116 can be blocked not to affect the inside of the housing body 22.

In addition, the second lens assembly 120 of the embodiment may include one or more of the second housing 122, the second lens group (not shown), and the second magnet 126. The second housing 122 may include a second lens housing 122a accommodating a second lens group (not shown) and a second driving unit housing 122b accommodating the second magnet 126. In addition, the second lens housing 122a may include a fifth pin guide part 122p5 fitted to the first guide pin 51.

In addition, the second housing 122 further includes a second-second yoke (not shown) under the second magnet 126 inside the second driving unit housing 122b, so that the magnetic force of the second magnet 126 can be blocked not to affect the inside of the housing body 22.

Hereinafter, the first lens assembly 110 will be described with reference to FIGS. 7 and 8.

FIG. 7 is a perspective view of a first lens assembly 110 and a third driving unit 141 in the first actuator 100 according to the embodiment shown in FIG. 6, and FIG. 8 is an example of interaction between the first magnet 116 and the second coil unit 141b in the first actuator 100.

Referring to FIG. 7, the first lens assembly 110 may include a first lens housing 112a and a first driving unit housing 112b. The first lens housing 112a functions as a barrel or a container, and a first lens group (not shown) may be mounted. The first lens group (not shown) may be a moving lens group, and may include a single lens or a plurality of lenses. The second housing 122 of the second lens assembly 120 may also include a second lens housing 122a and a second driving unit housing 122b.

Next, a first magnet 116 may be disposed on the first driving part housing 112b of the first lens assembly 110.

The first magnet 116 of the first lens assembly 110 may be a magnet driving unit, but is not limited thereto. For example, the first magnet 116 may include a first magnet that is a permanent magnet. In addition, the second driving unit 126 of the second lens assembly 120 may also be a magnet driving unit, but is not limited thereto.

With reference to FIG. 8 for a moment, an interaction in which an electromagnetic force (DEM) is issued between the first magnet 116 and the second coil unit 141b in the first actuator 100 according to the embodiment will be described.

As shown in FIG. 8, in the first actuator 100 according to the embodiment, the magnetization method of the first magnet 116 may be a vertical magnetization method. For example, in the embodiment, both the N pole 116N and the S pole 116S of the first magnet 116 may be magnetized to face the second coil part 141b. Accordingly, the N-pole 116N and the S-pole 116S of the first magnet 116 may be disposed so as to correspond to a region in which the current flows in the y-axis direction perpendicular to the ground in the second coil unit 141b.

Referring to FIG. 8, in an embodiment, a magnetic force DM may be applied in a direction opposite to the x-axis at the N pole 116N of the first magnet 116 and a current DE may flow in the y-axis direction in the region of the second coil part 141b corresponding to the N pole 116N. Accordingly, electromagnetic force DEM may act in the z-axis direction according to Fleming's left-hand rule.

In addition, in the embodiment, a magnetic force DM may be applied in the x-axis direction from the S pole 116S of the first magnet 126 and a current DE may flow in a direction opposite the y-axis perpendicular to the ground in the second coil part 141b corresponding to the S pole 116S. Accordingly, electromagnetic force DEM may act in the z-axis direction according to Fleming's left-hand rule.

At this time, the third driving unit 141 including the second coil unit 141b is in a fixed state such that the first lens assembly 110, which is a mover in which the first magnet 116 is disposed, may be moved back and forth in a direction parallel to the z-axis direction by the electromagnetic force DEM according to the current direction. The electromagnetic force DEM may be controlled in proportion to the current DE applied to the second coil unit 141b.

Similarly, in the camera module according to the embodiment, electromagnetic force DEM is generated between the second magnet 126 and the first coil unit 142b, so that the second lens assembly 120 may be moved horizontally with respect to the optical axis.

Referring back to FIG. 7, in an embodiment, the first driving unit housing 112b may guide the first lens assembly 110 in the optical axis direction by having at least one pin guide part 112p. In an embodiment, the pin guide part 112p may include the first pin guide part 112p1 and the second pin guide part 112p2.

For example, the first driving part housing 112b may include a first pin guide part 112p1 protruding upward, and a first guide hole 112h1 may be disposed in the first pin guide part 112p1.

In addition, the first driving part housing 112b may further include a second pin guide part 112p2 protruding upward and spaced apart from the first pin guide part 112p1. A second guide hole 112h2 may be disposed in the second pin guide part 112p2.

According to the embodiment, the first guide pin 51 is inserted into the first and second guide holes 112h1 and 112h2 of the first pin guide part 112p1 and the second pin guide part 112p2, so that the first lens assembly 110 can be precisely guided parallel to the optical axis direction.

According to this, according to the embodiment, the first pin guide part 112p1 and the second pin guide part 112p2 of the first housing 112 contact the first guide pin 51 to minimize the contact area to each other, thereby reducing frictional resistance. Accordingly, according to the embodiment, there are technical effects such as improvement of driving force and reduction of power consumption by preventing occurrence of friction torque during zooming.

In addition, according to the embodiment, by reducing the weight of the first driving unit housing 112b, friction torque can be reduced, thereby improving driving force during zooming, reducing power consumption, and improving control characteristics.

For example, according to the embodiment, a region other than the first pin guide part 112p1 and the second pin guide part 112p2 is removed from the upper region of the first driving part housing 112b where the first guide pin 51 is located. Accordingly, by reducing the weight of the first driving unit housing 112b, frictional resistance can be reduced, thereby improving driving force during zooming, reducing power consumption, and improving control characteristics.

With continued reference to FIG. 7, the first lens housing 112a includes at least one pin guide part 112p protruding to the side, such that it is possible not only to guide the movement of the first lens assembly 110 in the optical axis direction, but also to prevent the central axis from being distorted by preventing the lens unit from tilting upward and downward.

For example, the first lens housing 112a may include a third pin guide part 112p3 protruding to the side, and a first guide groove 112r1 may be disposed in the third pin guide part 112p3.

According to the embodiment, the second guide pin 52 can be inserted into the first guide groove r1 of the third pin guide part 112p3, so that the first lens assembly 110 can be precisely guided parallel to the optical axis direction.

Accordingly, according to an embodiment, by supporting the second guide pin 52 in the third pin guide part 112p3 of the first lens housing 112a, tilting of the lens portion upward and downward may be prevented, thereby preventing the central axis from twisting.

In addition, according to the embodiment, the third pin guide portion 112p3 in the first lens housing 112a may contact the second guide pin 52, so frictional resistance can be prevented by minimizing the frictional area, and there are technical effects such as improvement of driving force, reduction of power consumption, and improvement of control characteristics during zooming.

In addition, according to the embodiment, the friction torque can be reduced by reducing the weight of the first lens housing 112a, thereby improving driving force during zooming, reducing power consumption, and improving control characteristics.

For example, according to the embodiment, by removing an area other than the third pin guide part 112p3 from the side area of the first lens housing 112a where the second guide pin 52 is located, it is possible to reduce the weight and reducing the friction torque, so there are technical effects such as improvement in driving force during zooming, reduction in power consumption and improvement in control characteristics.

Next, FIG. 9 is a partial perspective view of the first actuator 100 shown in FIG. 7. In the first actuator 100 according to the embodiment, the third driving unit 141 may further include a first Hall sensor 143a inside the second coil unit 141b.

For example, according to the embodiment, a compact camera module can be implemented by arranging the first Hall sensor 143a in the inner area of the second coil unit 141b to reduce the area occupied by the Hall sensor.

In addition, according to the embodiment, there is a special technical feature that enables a compact camera module to be implemented by using the first driving magnet 116 in common without using a separate sensing magnet.

Accordingly, according to the embodiment, there is a technical effect that the zooming function can be smoothly performed even in a compact camera module.

Next, FIG. 10 is a graph showing Hall sensor linearity according to a stroke of the first camera module 1000 shown in FIG. 9.

Referring to FIG. 10, it can be seen that Hall Linearity is very excellent when the stroke of the lens assembly in the first actuator 100 according to the implementation is about 4 mm.

Accordingly, according to the embodiment, the first Hall sensor 143a is placed in the center of the first driving magnet 116, there is a technical effect in that only one first Hall sensor 143a can greatly improve the reliability of the position measurement of the lens.

Next, FIG. 11A is a detailed perspective view of the first actuator 100 of the embodiment, and FIG. 11B is a plan view of the first actuator 100 of the embodiment shown in FIG. 11A.

The first group of circuit board 410 of the first actuator 100 of the embodiment may include a single or a plurality of circuit boards. For example, the first group of circuit board 410 may include a fourth circuit board 411, a second circuit board 412, a third circuit board 413, a first circuit board 414, a first connection substrate 411C and a second connection substrate 412C.

The second circuit board 412 may include a gyro sensor 151 that senses motion, a first electronic device 152, and a second electronic device 153. The first electronic device 152 may be a driver IC, and the second electronic device 153 may be an EEPROM, but is not limited thereto.

The third circuit board 413 may be electrically connected to a driving unit driving the lens unit, and an image sensor 190 may be disposed on the first circuit board 414.

The fourth circuit board 411 and the second circuit board 412 may be electrically connected by a first connection board 411c, and the second circuit board 412 and the first circuit board 414 may be electrically connected by the connection substrate 412c.

In the embodiment, the first group of circuit boards 410 may It may include any substrate with a wiring pattern such as a rigid printed circuit board (Rigid PCB), a flexible printed circuit board (Flexible PCB), a rigid flexible printed circuit board (Rigid Flexible PCB), and the like.

For example, the first to fourth circuit boards 414, 412, 413, and 411 may be rigid printed circuit boards (Rigid PCB), and the first and second connection boards 411c and 412c may be a flexible PCB or a rigid flexible PCB, but is not limited thereto.

Referring to FIGS. 11A and 11B, the first actuator 100 of the embodiment may detect motion by employing the gyro sensor 151 and may move the lens to correct the optical path, thereby implementing OIS technology to correct image quality.

The movement of the camera module may largely include a linear movement that moves along an axis and a rotational movement that rotates about the axis.

First, as shown in FIG. 11A, the linear movement may include a movement in the horizontal coordinate axis (x-axis) direction of the camera module, a movement in the vertical coordinate axis (y-axis) direction of the camera module, and a movement in the optical axis (z-axis) direction arranged in the front-rear direction of the camera module.

Next, as in FIG. 11A, the rotational movement may include a Pitch meaning a vertical rotational movement using the horizontal coordinate axis (x axis) of the first actuator 100 as a rotation axis, a yaw meaning a left-right rotational movement using the vertical coordinate axis (y-axis) of the first actuator 100 as a rotation axis, and a roll meaning a rotational movement of the optical axis (z-axis) passing in the front and rear direction of the first actuator 100 as a rotation axis.

In an embodiment, the gyro sensor 151 may employ a two-axis gyro sensor that detects two rotational motion amounts of pitch and yaw representing a large movement in a two-dimensional image frame, and more accurate hand shake. For correction, a 3-axis gyro sensor that detects all the amount of movement of the pitch, yaw, and roll may be employed. The movement corresponding to the pitch, yaw, and roll detected by the gyro sensor 151 may be converted into an appropriate physical quantity according to a camera shake correction method and a correction direction.

In an embodiment, the fourth circuit board 411 may be disposed to extend in the horizontal coordinate axis (x-axis) direction of the first actuator 100, and the second circuit board 412 may be disposed in a y-axis direction perpendicular to the horizontal coordinate axis (x-axis) direction. In this case, the second circuit board 412 may be disposed to extend in a direction horizontal to the optical axis (z-axis) direction.

According to the embodiment, since the gyro sensor 151 is disposed on the second circuit board 412, there is a technical effect of implementing a micro camera module.

For example, in the un-disclosed internal technology, as the length of the first group of circuit boards 410 in the horizontal coordinate axis (x-axis) direction of the camera module occupies about 15 mm, there was a limit to implementing a micro-camera module.

However, as shown in FIGS. 11A and 11B, the gyro sensor 151 is disposed on the second circuit board 412 which is vertical to the horizontal coordinate axis (x-axis) direction and extends in a horizontal direction to the optical axis (z-axis) direction. Accordingly, by controlling the size of the first actuator 100 to the level of the horizontal width of the first housing 20, there is a technical effect of implementing a micro camera module.

For example, the area of the circuit board area extending in the horizontal coordinate axis (x-axis) direction in which the gyro sensor was disposed in the related internal technology can be reduced by an area of about 3 to 4 mm or more (about 25% or more) such that there is a technical effect that can implement a micro camera module.

According to an embodiment, the gyro sensor 151 may be disposed on the second circuit board 412 disposed to be perpendicular to the horizontal coordinate axis (x-axis) direction and extended in a horizontal direction to the optical axis (z-axis) direction. Accordingly, the central axis of the gyro sensor 151 may be horizontal in the horizontal coordinate axis (x-axis) direction but perpendicular to the optical axis (z-axis) direction.

The second circuit board 412 may be disposed extending in a vertical axis direction in a horizontal coordinate plane perpendicular to the optical axis.

Accordingly, in the embodiment, in the measurement data of the gyro sensor 151, the pitch movement may be controlled by replacing the roll and the roll movement by the pitch, but the present disclosure is not limited thereto.

Alternatively, in designing the measurement data of the gyro sensor 151, the pitch movement may be set as a pitch, and the roll movement may be set as a roll.

Meanwhile, in the related art, as the gyro sensor is disposed apart from the lens unit, there is a technical problem in that an error occurs between the movement degree of the lens unit and the movement degree sensed by the gyro sensor according to the user's movement. For example, when the camera module rotates around the gyro sensor, the difference between the degree of movement of the gyro sensor and the degree of movement of the lens unit becomes large, resulting in a problem in that the accuracy of the angular acceleration data is degraded.

However, in the embodiment, the gyro sensor 151 may be disposed in close contact with the side of the first housing 20 of the first actuator 100 in which the lens unit is disposed. Accordingly, the degree of movement of the lens unit according to the movement of the user and the error of movement information detected by the gyro sensor can be significantly reduced. Therefore, there is a special technical effect that can greatly improve the precision of the angular acceleration of the gyro sensor.

Next, FIG. 11C is a perspective view of the camera module of the embodiment shown in FIG. 11A in which the first housing is removed from the first actuator, FIG. 11D is a bottom view of a perspective view in which the first housing is removed from the first actuator in the camera module of the embodiment shown in FIG. 11C, and FIG. 11E is a perspective view of a first housing in a first actuator in the camera module of the embodiment shown in FIG. 11A and a detailed perspective view of the first housing body 22.

Referring to FIGS. 11C to 11E, the actuator according to the embodiment may include a first circuit board 414 on which an image sensor 190 is disposed, and a first housing 20 disposed on the first circuit board 414, lens assembly 110 and 120 disposed in the first housing 20, a second circuit board 412 disposed on the first side portion 22a of the first housing 20 on which the gyro sensor 151 is disposed, and a third circuit board 413 driving the lens assembly.

Referring to FIG. 11E, the first housing base 22 of the first housing 20 may include a first side portion 22a, a second side portion 22b, and a third side portion 22c.

In this case, the first side portion 22a of the first housing may include a first end 22a1 on which the second circuit board 412 is disposed and a second end 22a2 on which the first region 413a of the third circuit board is disposed, and a step 22as may be formed by the first end 22a1 and the second end 22a2.

The first side portion 22a of the first housing 20 may include a hole 22ah, and the first coil 142b may be firmly inserted into the hole 22ah.

Referring back to FIG. 11C, the third circuit board 413 may be disposed on the first side portion 22a of the first housing, and the third circuit board 413 may include a first region 413a in which the first coil 142b driving the lens assembly is disposed.

In addition, the first coil 142b may overlap the second circuit board 412 in a direction perpendicular to the optical axis direction.

Referring to FIG. 11D, the embodiment may include a fourth circuit board 411 connected to the second circuit board 412 and on which a connector 411c is disposed.

Referring to FIG. 11C, the third circuit board 413 may include a third region 413c disposed on the third side portion 22c of the first housing and in which the second coil 412a is disposed and a second region 413b disposed on a second side portion 22b connecting between the first side portion 22a and the third side portion 22c of the first housing. Next, FIG. 12A is a perspective view of a shield can in the camera module of the embodiment shown in FIG. 2, FIG. 12B is a bottom perspective view of a shield can in the camera module of the embodiment shown in FIG. 12A, and FIG. 13 is a partially enlarged view of a shield can in the camera module of the embodiment shown in FIG. 12B.

In the camera module 1000 of the embodiment, a shield cover 510 may be additionally installed on the outer surface of the first housing of each camera module. The shield cover 510 may also be referred to as a cover housing.

The shield cover 510 may include a first shield region 510A corresponding to the first actuator 100, a second shield region 510B corresponding to the second actuator 200, and a third shield region 510C corresponding to a second camera module 1000B.

The shield cover 510 may be formed of a metal material such as steel SUS, and may shield electromagnetic waves flowing into and out of the camera module, and also prevent outer material from entering the camera module.

A first recess 511a in which the first group of circuit boards 410 is disposed may be provided at a lower end of the first shield region 510A. A second recess 511b in which the second group of circuit boards 420 is disposed may be provided at a lower end of the second shield region 510B.

Next, referring to FIG. 13, in the camera module of the embodiment, a support bracket 513 may be provided on the shield cover 510, and a guide groove 513R in which the gyro sensor 151 is disposed may be included in the support bracket 513.

Accordingly, since the gyro sensor 151 can be firmly fixedly disposed in the guide groove 513R of the support bracket 513, the precise leveling of the gyro sensor 151 can be secured high.

For example, as in the embodiment, as the gyro sensor 151 can be firmly fixed and disposed in the guide groove 513R of the support bracket 513, the precise leveling of the gyro sensor 151 can be very precisely secured within about 1°.

In the related art, no attempt has been made to arrange the center of the gyro sensor in a direction perpendicular to the direction of the optical axis rather than in a direction parallel to the direction of the optical axis. In particular, in the gyro sensor, since leveling is important in the accuracy of the data, it has been difficult to attempt to arrange the center of the gyro sensor in a direction not parallel to the optical axis direction.

However, in the camera module of the embodiment, the support bracket 513 is provided on the shield cover 510, and the gyro sensor 151 is provided by including a guide groove 513R in which the gyro sensor 151 is disposed in the support bracket 513. As the gyro sensor 151 can be rigidly fixedly disposed, there is a special technical effect that can secure a high precise leveling of the gyro sensor 151 and a special technical effect that can provide a micro-miniature camera module. The guide groove 513R may be referred to as a recess, but is not limited thereto.

In addition, regarding the arrangement of the gyro sensor of the camera module, there is a problem that the angular acceleration error probability increases as the gyro sensor is further away from the camera module, and there is a technical contradiction that the error rate due to temperature drift increases as the gyro sensor is closer.

However, in the embodiment, a support bracket 513 is provided on the shield cover 510, and a guide groove 513R in which the gyro sensor 151 is disposed may be included in the support bracket 513 such that the gyro sensor 151 can be rigidly fixedly disposed and can be disposed close to the driving unit and the lens unit of the camera module. Therefore, the accuracy of the angular acceleration can be improved, and the error rate due to temperature drift can be reduced by disposing the gyro sensor away from the image sensor 190, which generates a lot of heat such that there is a complex technical effect that can provide a micro camera module while remarkably improving the precision of the gyro sensor.

In addition, in the related art, as the gyro sensor is spaced apart from the lens unit, there is a technical problem that an error occurs between the movement degree of the lens unit and the movement degree detected by the gyro sensor according to the movement of the user.

For example, when the camera module rotates around the gyro sensor, the difference between the degree of movement of the gyro sensor and the degree of movement of the lens unit becomes large, resulting in a problem in that the accuracy of the angular acceleration data is degraded.

On the other hand, in the embodiment, as the gyro sensor is closely disposed on the side of the first housing 20 in which the lens unit is disposed, the degree of movement of the lens unit according to the user's movement and the error in movement information detected by the gyro sensor are greatly reduced such that the accuracy of the angular acceleration of the sensor can be remarkably improved.

In addition, according to the embodiment, in addition to the shielding effect of the shield cover 510, there is also a complex technical effect of shielding EMI, EMC, noise, etc. by the support bracket 513.

Next, the second actuator 200 will be described with reference to FIGS. 14A to 26B. The second actuator 200 may be an OIS (Optical Image Stabilizer) actuator, but is not limited thereto.

First, FIG. 14A is a perspective view of a second actuator in a first direction in the camera module of the embodiment shown in FIG. 3A and FIG. 14B is a perspective view of a second actuator in a second direction in the camera module of the embodiment shown in FIG. 3A.

Referring to FIGS. 14A and 14B, the second actuator 200 of the embodiment may include a second housing 210, an OIS unit 220 disposed on the second housing 210, a prism unit 230 disposed on the OIS unit 220, and a second driving unit 72C (see FIG. 15) electrically connected to the second circuit board 250.

Accordingly, according to the embodiment, by providing the OIS unit 220 disposed on the second housing 210, there is a technical effect of providing an ultra-slim, ultra-small actuator, and a camera module including the same.

In addition, according to the embodiment, by disposing the OIS unit 220 under the prism unit 230, there is a technical effect in that it is possible to secure a sufficient amount of light by solving the size limitation of the lens in the lens assembly of the optical system when the OIS is implemented.

In addition, according to the embodiment, the OIS unit 220 stably disposed on the second housing 210 is provided, and the variable prism 222cp including the shaper unit 222 and the first driving unit 72M, which will be described later, is provided. When OIS is implemented through the provided lens unit 222c, there is a technical effect of minimizing the occurrence of a decent or a tilt phenomenon to produce the best optical characteristics.

In addition, according to an embodiment, when implementing OIS, the first driving unit 72M, which is a magnet driving unit, may be disposed in the second actuator 200 separated from the first camera actuator 100, accordingly, there is a technical effect capable of preventing magnetic field interference with the AF of the first actuator 100 or the magnet for zoom.

In addition, according to the embodiment, the OIS may be implemented using the shaper unit 222 and the first driving unit 72M for the lens unit 222c including the variable prism 222cp, unlike moving a plurality of conventional solid lenses such that there is a technical effect that can implement OIS with low power consumption.

The second actuator 200 of the embodiment will be described in more detail with reference to the following drawings.

FIG. 15 is a perspective view of a second circuit board 250 and a second driving unit 72C of the second actuator 200 of the embodiment shown in FIG. 14B, FIG. 16A is a partially exploded perspective view of the second actuator 200 of the embodiment shown in FIG. 14B and FIG. 16B is a perspective view of the second circuit 200 board removed from the second actuator of the embodiment shown in FIG. 14B.

First, referring to FIG. 15, the second circuit board 250 may be connected to a predetermined power supply unit (not shown) to apply power to the second driving unit 72C. The second circuit board 250 is a circuit board having a wiring pattern that can be electrically connected, such as a rigid printed circuit board (Rigid PCB), a flexible printed circuit board (Flexible PCB), and a rigid flexible PCB.

The second driving unit 72C may include a single or a plurality of unit driving parts, and may include a plurality of coils. For example, the second driving unit 72C may include a fifth unit driving part 72C1, a sixth unit driving part 72C2, a seventh unit driving part 72C3, and an eighth unit driving part (not shown).

In addition, the second driving unit 72C may further include a Hall sensor (not shown) to recognize the position of the first driving unit 72M (see FIG. 16A) to be described later. For example, a first Hall sensor (not shown) in the fifth unit driving part 72C1 and a second Hall sensor (not shown) in the seventh unit driving part 72C3 may be further included.

The embodiment includes an OIS unit 220 stably disposed on the second housing 210 and OIS can be implemented for the lens unit 222c including the variable prism by using the second driving unit 72C, which is a coil driving unit, and the first driving unit 72M, which is a magnet driving unit such that it is possible to achieve the best optical characteristics by minimizing the occurrence of decent or tilt.

In addition, unlike moving a plurality of conventional solid lenses, in the embodiment, a lens unit 222c including a variable prism can be driven by using a first driving unit 72M as a magnet driving unit and a second driving unit 72C as a coil driving unit. Unit 222 such that there is a technical effect that OIS can be implemented with low power consumption by driving the shaper unit 222.

Next, referring to FIGS. 16A and 16B, the second actuator 200 of the embodiment may include a second housing 210, an OIS unit 220 disposed on the second housing 210 and including a shaper unit 222, a first driving unit 72M, a second driving unit 72C disposed on the second housing 210, and a prism unit 2230 including a fixed prism 232 and disposed on the OIS unit 220.

Referring to FIG. 16A, the second housing 210 has a predetermined opening 212H through which light can pass through the housing body 212, and a housing side portion 214P extending above the housing body 212 and including a driving unit hole 214H in which the driving unit 72C is disposed.

For example, the second housing 210 may extend above the housing body 212 and may include a first housing side portion 214P1 including a first driving unit hole 214H1 in which the second driving unit 72C is disposed, and a second housing side portion 214P2 including a second driving unit hole 214H2 in which the second driving unit 72C is disposed.

According to an embodiment, the second driving unit 72C may be disposed on the housing side portion 214P such that OIS can be implemented by driving the shaper unit 222 with respect to the lens unit 222c including the variable prism through electromagnetic force together with the first driving unit 72M, which is a magnet driving unit, so it is possible to implement OIS with low power consumption.

In addition, according to an embodiment, the lens unit 222c including the variable prism can be controlled through the second driving unit 72C stably fixed to the housing side 214P and the first driving unit 72M, which is a magnet driving unit, thereby implementing OIS. There is a technical effect that can produce the best optical characteristics by minimizing the occurrence of a decent or tilt phenomenon.

Next, the fixed prism 232 may be a right-angle prism, and may be disposed inside the first driving unit 72M of the OIS unit 220. In addition, in an embodiment, a predetermined prism cover 234 is disposed on the upper side of the fixed prism 232 so that the fixed prism 232 can be closely coupled to the second housing 210 so that there is a technical effect that prevents prism tilt and does not cause decenter in the second actuator 200.

In addition, according to the embodiment, there is a technical effect of providing an ultra-slim, ultra-miniature actuator and a camera module including the same by utilizing the space under the prism unit 230 and arranging the OIS unit 220 to overlap each other.

In particular, according to the embodiment, since the prism unit 230 and the lens unit 222c including the variable prism can be arranged very close, there is a special technical effect in that even if the optical path change is finely performed in the lens unit 222c, the optical path change can be widened in the actual image sensor unit.

For example, referring to FIG. 20B for a moment, the second movement path L1a of the light beam changed by the fixed prism 232 may be changed in the variable prism 222cp to be changed to the third movement path L1b.

In this case, according to the embodiment, the lens unit 222c including the fixed prism 232 and the variable prism may be arranged very close. Accordingly, a distance between the lens unit 222c and the image plane 190P of the first lens assembly (not shown) can be secured relatively far.

Accordingly, it is possible to secure a wide first distance D16 reflected on the image plane 190P according to the change of the slope of the predetermined angle Θ in the variable prism 222cp, so that the optical path change in the lens unit 222c is finely performed. Even so, there is a special technical effect that can secure a wide range of optical path changes in the actual image sensor unit.

On the other hand, according to an embodiment, by disposing the gyro sensor 151 on the first actuator 100 as shown in FIGS. 11A and 11B, the movement of the camera module is detected to change the slope of the predetermined angle Θ of the variable prism 222cp. According to this, OIS technology that corrects the image quality can be implemented by modifying the optical path.

Meanwhile, in the related art, as the gyro sensor is disposed apart from the lens unit, there is a technical problem in that an error occurs between the movement degree of the lens unit and the movement degree sensed by the gyro sensor according to the user's movement. For example, when the camera module rotates around the gyro sensor, the difference between the degree of movement of the gyro sensor and the degree of movement of the lens unit becomes large, resulting in a problem in that the accuracy of the angular acceleration data is degraded.

However, in the embodiment, as the gyro sensor 251 is disposed in close contact with the side of the first housing 20 in which the lens unit is disposed, the degree of movement of the lens unit according to the user's movement and the error of movement information detected by the gyro sensor are significantly reduced. As a result, there is a special technical effect that can greatly improve the precision of the angular acceleration of the gyro sensor.

Next, FIG. 17A is an exploded perspective view of the OIS unit 220 of the second actuator 200 of the embodiment shown in FIG. 16A, and FIG. 17B is a combined perspective view of the OIS unit 220 of the second actuator of the embodiment shown in FIG. 17A, and FIG. 17C is an exploded perspective view of the first driving unit 72M in the OIS unit 220 shown in FIG. 17A.

Referring to FIGS. 17A and 17B, in the embodiment, the OIS unit 220 may include a shaper unit 222 and a first driving unit 72M.

The shaper unit 222 may include a protrusion 222b extending laterally from the shaper body 222a including a hole through which light can pass and the shaper body 222a, and is coupled to the first driving unit 72M in a first vertical direction.

In addition, the shaper unit 222 may include a lens unit 222c disposed on the shaper body 222a in a second vertical direction opposite to the first vertical direction and including a variable prism.

Accordingly, according to an embodiment, OIS can be implemented for the lens unit 222c including the variable prism using the OIS unit 220 including the shaper unit 222 and the first driving unit 72M such that there is a technical effect of minimizing the occurrence of a decent or a tilt phenomenon to produce the best optical characteristics.

Specifically, referring to FIGS. 17A and 17B, the first driving unit 72M may include a single or a plurality of magnet frames 72MH1 and 72MH2 coupled to the protrusion 222b and a unit driving part disposed on the magnet frames 72MH1, 72MH2.

For example, the first driving unit 72M may include a first magnet frame 72MH1 and a second magnet frame 72MH2. A first unit driving part 72M1, a second unit driving part 72M2 may be disposed in the first magnet frame 72MH1 and a third unit driving part 72M3, a fourth unit driving part 72M4 may be disposed in the second magnet frame 72MH2.

Each of the first to fourth unit driving parts 72M1, 72M2, 72M3, and 72M4 may include first to fourth magnets.

FIG. 17C is an exploded perspective view of the first driving unit 72M in the OIS unit 220 shown in FIG. 17A.

In an embodiment, the first driving unit 72M may further include yokes 72MY disposed on the first and second magnet frames 72MH1 and 72MH2 to block interference of a magnetic field.

For example, the first magnet frame 72MH1 of the first driver 72M may have a frame groove 72MR, and a yoke 72MY may be disposed in the frame groove 72MR. Thereafter, the first unit driving part 72M1 and the second unit driving part 72M2 may be respectively disposed on the yoke 72MY.

In this case, the yoke 72MY may have a yoke protrusion 72MYP and may be firmly coupled to the protrusion 222b of the shaper unit 222.

Next, FIG. 18 is a perspective view of the shaper unit 222 of the second actuator of the embodiment shown in FIG. 17A.

Referring to FIG. 18, the shaper unit 222 may include a shaper body 222a including an opening through which light can pass, a protrusion 222b extending laterally from the shaper body 222a and coupled to the first driving part 72M in a first vertical direction, and a lens unit 222c disposed on the shaper body 222a in a second vertical direction opposite to the first vertical direction including a variable prism 222cp.

Specifically, in an embodiment, the shaper unit 222 may include a plurality of magnet support portions respectively extending from the shaper body 222a to both sides. For example, the shaper unit 222 may include a first protrusion 222b1, a second protrusion 222b2 branching from the shaper body 222a to a first side and extending, and a third protrusion 222b3, a fourth protrusion 222b4 branching and extending toward the second side.

The first driving unit 72M may include first to fourth unit driving parts 72M1, 72M2, 72M3, and 72M4 respectively coupled to the first to fourth protrusions 222b1, 222b2, 222b3, and 222b4.

Referring to FIG. 18, in an embodiment, the shaper unit 222 may include a coupling groove 222bh in the magnet support portion to be coupled to a magnet frame. Accordingly, the OIS unit 220 as shown in FIG. 17B may be combined.

According to the embodiment, in a state in which the first driving unit 72M is firmly coupled to the shaper unit 222, the OIS is implemented through the optical path control of the lens unit 222c having a variable prism such that there is a technical effect that can produce the best optical properties by minimizing the occurrence of phenomena.

Next, FIG. 19 is a cross-sectional view of the lens unit 222c along the line A1-A1' of the shaper unit 222 shown in FIG. 18.

Referring to FIG. 19, in an embodiment, the lens unit 222c may include a light-transmitting support part 222c2, a bracket 222cb disposed on the light-transmitting support part 222c2 with a predetermined accommodation space, a variable prism 222cp disposed in the receiving space of the bracket 222cb, a flexible plate 222cm disposed on the variable prism 222cp, and a second light-transmitting support (not shown) disposed on the flexible plate 222cm.

The light-transmitting support part 222c2 and the second light-transmitting support part (not shown) may be formed of a light-transmitting material. For example, the light-transmitting support part 222c2 and the second light-transmitting support part may be formed of glass, but are not limited thereto.

The light-transmitting support part 222c2 and the second light-transmitting support part may have a hollow circular ring shape or a prismatic ring shape.

The size of the second light-transmitting support part (not shown) may be formed to be smaller than the size of the accommodation space of the bracket 222cb.

The variable prism 222cp may include an optical liquid disposed in a space formed by the translucent support 222c2, the support bracket 222cb, and the flexible plate 222cm, or may include a wedge prism.

In the embodiment, the optical liquid for the variable prism 222cp can be transparent, may have low fluorescence, and may not be toxic. For example, the optical liquid of the embodiment may employ a chlorofluorocarbon (CFC) component, but is not limited thereto.

The bracket 222cb may be formed of an elastic material or a non-stretch material. For example, the bracket 222cb may be made of an elastic film or a metal material, but is not limited thereto.

If the flexible plate 222cm may receive a predetermined force by the shaper body 222a according to the movement of the first driving part 72M, a part of the flexible plate 222cm may move upward or downward due to the characteristic of a flexible elastic material as shown in FIG. 20B, and the shape of the variable prism 222cp may be variable.

For example, the flexible plate 222cm may be a reverse osmosis (RO) membrane, a nano filtration (NF) membrane, an ultra-filtration (UF) membrane, a micro filtration (MF) membrane, etc., but is not limited thereto. Here, the RO membrane is a membrane having a pore size of about 1 to 15 angstroms, the NF membrane is a membrane having a pore size of about 10 angstroms, and the UF membrane is a membrane having a pore size of about 15 to 200 angstroms and the MF membrane may be a membrane having a pore size of about 200 to 1000 angstroms.

The embodiment may include an OIS unit 220 stably disposed on the second housing 210, and OIS can be implemented for a lens unit 222c including a variable prism 222cp using the shaper unit 222 and the first driving unit 72M such that there is a technical effect that can produce the best optical characteristics by minimizing the occurrence of decent or tilt.

Next, FIGS. 20A to 20B are diagrams illustrating the operation of the first actuator 100 according to the embodiment.

For example, FIG. 20A is an exemplary view before the operation of the OIS actuator of the embodiment, and FIG. 20B is an exemplary view after the operation of the OIS actuator of the embodiment.

In a broad meaning, in an embodiment, the prism may include a fixed prism 232 that changes the path of a predetermined light beam, and a variable type prism 222cp that is disposed under the fixed prism 232 and changes the path of light rays emitted from the fixed prism 232.

Referring to FIGS. 20A and 20B, the second actuator 200 of the embodiment can control the optical movement path by changing the shape of the variable prism 222cp through the first driving unit 72M and the second driving unit 72C.

For example, in an embodiment, the second actuator 200 may control the path of the light beam by changing the vertex angle Θ of the variable prism 222cp through the first driving unit 72M, which is a magnet driving unit.

For example, referring to FIG. 20A, the incident light ray L1 can be changed to the second movement path L1a by the fixed prism 232, but the optical path is not changed in the variable prism 222cp.

On the other hand, referring to FIG. 20B, the second movement path L1a of the light beam changed by the fixed prism 232 may be changed as the third movement path L1b in the variable prism 222cp.

For example, when the flexible plate 222cm receives a predetermined force by the shaper body 222a according to the movement of the first driving unit 72M, the second light-transmitting support unit (not shown) receives the force. The force is transmitted to the flexible plate 222cm, and due to the characteristic of the flexible elastic material of the flexible plate 222cm, a part may move upward or downward, and the shape of the variable prism 222cp may be variable.

For example, the upper left of the shaper body 222a receives the force F2 in the second direction by the first unit driving part 72M1, and the upper right of the shaper body 222a is applied to the second unit driving part 72M2. By this, it can be varied according to the force F1 in the first direction, and the second light-transmitting support (not shown) receives the force according to the movement of the shaper body 222a, and the flexible plate 222cm may be varied with a slope of a predetermined angle Θ by this force.

Hereinafter, with reference to FIG. 20B, an image shake prevention apparatus for controlling the path of light rays by changing the shape of the variable prism 222cp through the first driving unit 72M will be described in more detail.

First of all, according to the embodiment, it may be necessary to move the image to the side by the first distance D1δ on the image plane 190P of the first lens assembly (not shown) provided in the first actuator 100 according to the occurrence of hand shake.

In this case, D1 is the distance from the variable prism 222cp to the image plane 190P of the first lens assembly, δ is the chromatic aberration of the variable prism 222cp, and Θ may be the vertex angle of the variable prism 222cp.

That is, according to the embodiment, after the vertex angle Θ to be changed of the variable prism 222cp is calculated, the path of the light beam may be controlled as the third path L1b by changing the vertex angle Θ of the variable prism 222cp through the first driving unit 72M.

At this time, between the chromatic aberration δ of the variable prism 222cp and the vertex angle Θ of the variable prism 222cp, a relationship of δ=(n−1)×Θ may be established (where n is a refractive index of the variable prism 222cp with respect to a center wavelength of the band of interest).

According to the embodiment, since the prism unit 230 and the lens unit 222c including the variable prism can be arranged very close, even if the optical path change is finely performed in the lens unit 222c, there are special technical effects in that the optical path change can be secured widely in the actual image sensor unit.

For example, according to the embodiment, since the lens unit 222c including the fixed prism 232 and the variable prism may be arranged very close, the distance between the lens unit 222c and the image plane 190P of the first lens assembly (not shown) can be secured relatively far. Accordingly, in the variable prism 222cp, the first distance D16 reflected on the image plane 190P can be secured widely according to the change in the slope of the predetermined angle Θ such that even if the optical path change is finely performed in the lens unit 222c, there is a special technical effect of ensuring a wide range of optical path changes in the actual image sensor unit.

Next, FIG. 21A is a diagram illustrating a first operation of the second actuator according to the embodiment.

For example, FIG. 21A is a view illustrating a first operation as viewed from the z-axis direction from the second actuator 200 according to the embodiment shown in FIG. 14B.

Referring to FIG. 21A, power can be applied to the second driver 72C through the second circuit board 250, so that current may flow through each coil. Accordingly, an electromagnetic force may be generated between the second driving unit 72C and the first driving unit 72M in the first direction F1 or the second direction F2 such that the flexible plate 222cm may be tilted at a predetermined angle by the moving first driving unit 72M, and accordingly, the apex angle Θ of the variable prism 222cp may be controlled.

For example, referring to FIG. 21A, the first unit driving part 72M1 and the second unit driving part 72M2 can be placed to generate magnetic force in the direction of the fifth unit driving part 72C1 and the sixth unit driving part 72C2. In addition, the third unit driving part 72M3 and the fourth unit driving part 72M4 can be placed to generate magnetic force in the direction of the seventh unit driving part 72C3 and the eighth unit driving part 72C4.

In this case, when the current C1 flows to the first direction in the fifth unit driving part 72C1 and the sixth unit driving part 72C2, a force F2 may be applied in the second direction. Meanwhile, when the current C1 flows to the first direction in the seventh unit driving part 72C3 and the eighth unit driving part 72C4, the force F1 may be applied in the first direction opposite to the second direction.

Accordingly, a force F2 may be applied to the flexible plate 222cm in the second direction from the first unit driving part 72M1 and the second unit driving part 72M2. In addition, the force F1 may be applied in the first direction from the third unit driving part 72M3 and the fourth unit driving part 72M4. Accordingly, by changing the apex angle Θ of the variable prism 222cp at a predetermined first angle, the path of light can be changed and controlled.

Next, FIG. 21B is a diagram illustrating a second operation of the second actuator 200 according to the embodiment.

For example, FIG. 21B is an exemplary view of a second operation viewed from the z-axis direction from the second actuator 200 according to the embodiment shown in FIG. 14B.

For example, power may be applied to the second driving unit 72C so that current may flow through each coil. Accordingly, an electromagnetic force may be generated between the second driving unit 72C and the first driving unit 72M in the first direction F1 or the second direction F2 such that the flexible plate 222cm may be tilted at a predetermined angle.

For example, referring to FIG. 21B, the first unit driving part 72M1 and the second unit driving part 72M2 may be disposed to generate magnetic force in the direction of the fifth unit driving part 72C1 and the sixth unit driving part 72C2. The third unit driving part 72M3 and the fourth unit driving part 72M4 may be disposed to generate magnetic force in the directions of the seventh unit driving part 72C3 and the eighth unit driving part 72C4.

In this case, a current C1 in the first direction may flow through the fifth unit driving part 72C1 and the seventh unit driving part 72C3. In addition, a current C2 in the second direction may flow through the sixth unit driving part 72C2 and the eighth unit driving part 72C4.

Accordingly, the first unit driving part 72M1 and the fourth unit driving part 72M4 may apply the force F2 in the second direction. In addition, the second unit driving part 72M2 and the third unit driving part 72M3 may apply a force F1 in the first direction.

Accordingly, a force F2 may be applied to the flexible plate 222cm of the variable prism 222cp in the second direction from the first unit driving part 72M1 and the fourth unit driving part 72M4. In addition, the second unit driving part 72M2 and the third unit driving part 72M3 may apply a force F1 in the first direction. Accordingly the apex angle Θ of the variable prism 222cp can be changed at a predetermined second angle, so that the path of light can be changed and controlled.

According to the embodiment, by disposing the gyro sensor 151 on the first actuator 100, the movement of the camera module can be detected, and the optical path can be corrected according to the change of the slope of the predetermined angle Θ of the variable prism 222cp such that it is possible to implement OIS technology that corrects the image quality.

Meanwhile, in the related art, as the gyro sensor is disposed apart from the lens unit, there is a technical problem in that an error occurs between the movement degree of the lens unit and the movement degree sensed by the gyro sensor according to the user's movement. For example, when the camera module rotates around the gyro sensor, the difference between the degree of movement of the gyro sensor and the degree of movement of the lens unit becomes large, resulting in a problem in that the accuracy of the angular acceleration data is degraded.

However, in the embodiment, as the gyro sensor 251 is disposed in close contact with the side of the first housing 20 in which the lens unit is disposed, the degree of movement of the lens unit according to the user's movement and the error of movement information detected by the gyro sensor are significantly reduced. As a result, there is a special technical effect that can greatly improve the precision of the angular acceleration of the gyro sensor.

In addition, according to the embodiment, there is a technical effect of providing an ultra-slim, ultra-miniature actuator and a camera module including the same by utilizing the space under the prism unit 230 and arranging the OIS unit 220 to overlap each other.

In addition, according to the embodiment, by disposing the OIS unit 220 under the prism unit 230, there is a technical effect that it is possible to secure a sufficient amount of light by solving the size limitation of the lens in the lens assembly of the optical system when the OIS is implemented.

In addition, the embodiment may include an OIS unit 220 stably disposed on the second housing 210 and OIS may be implemented for the lens unit 222c having the variable prism 222cp by using the shaper unit 222 and the first driving unit 72M such that there is a technical effect of minimizing the occurrence of a decent or a tilt phenomenon to produce the best optical characteristics.

In addition, according to an embodiment, in order to implement OIS, the first driving unit 72M, which is a magnet driving unit, may be disposed on the second actuator 200 separated from the first camera actuator 100 such that there is a technical effect capable of preventing magnetic field interference with the AF of the first actuator 100 or the magnet for zoom.

Next, FIG. 22 is a detailed perspective view of the first shaper unit 222A of the second actuator 200 according to the embodiment.

Referring to FIG. 22, the first shaper unit 222A includes a shaper body 222a including an opening 222ah through which light can pass, and a protruding region extending laterally from the shaper body 222a.

For example, the first shaper unit 222A may include a shaper body 222a disposed on the lens unit 222c, and including a first side, a second side corresponding to the first side, a first protruding region b12 protruding from the first side surface of the shaper body 222a and a second protruding region b34 protruding from the second side surface of the shaper body 222a.

The first protrusion area b12 may include a first protrusion 222b1 protruding from one surface of the first side and a second protrusion 222b2 protruding from the other surface of the first side and spaced apart from the first protrusion 222b1.

The second protrusion area b34 may include a third protrusion 222b3 protruding from one surface of the second side and a fourth protrusion 222b4 protruding from the other surface of the second side and spaced apart from the third protrusion 222b3.

In this case, the first protrusion 222b1 may include a first extension part b1p, a first support part b1e extending from the shaper body 222a to the first side, and a first coupling groove bh1 disposed on the first support part b1e.

In addition, the second protrusion 222b2 may include a second extension part b2p branching from and extending from the shaper body 222a to a first side from the first extension part b1p, a second support portion b2e and a second coupling groove b2h disposed on the second support portion b2e.

First and second unit driving parts 72M1 and 72M2 may be coupled to the first coupling groove 222bh1 and the second coupling groove b2h.

In addition, the third protrusion 222b3 may include a third extension part b3p extending from the shaper body 222a to the second side, a third support part b3e, and a third coupling groove b3h disposed on the third support part b3e.

In addition, the fourth protrusion 222b4 may include a fourth extension part b4p extending from the shaper body 222a to a second side by branching from the third extension part b3p, a fourth support part b4e, and a fourth coupling groove b4h disposed on the fourth support part b4e.

The third, fourth unit driving parts 72M3 and 72M4 may be coupled to the third coupling groove b3h and the fourth coupling groove b4h.

At this time, referring to FIG. 22, in an embodiment, a first support part b1e, which is an end of the first protrusion 222b1, and a second support part b2e, which is an end of the second protrusion 222b2, can be separated from each other and be spaced apart at a second distance D2.

In addition, referring to FIG. 22, in the embodiment, a third support part b3e, which is an end of the third protrusion 222b3, and a fourth support part b4e, which is an end of the fourth protrusion 222b4, can be separated from each other and can be spaced apart at a second distance D2.

Meanwhile, FIG. 23 is a perspective view of the second shaper unit 222B of the second actuator 200 according to the embodiment.

Referring to FIG. 23, in an embodiment, the second shaper unit 222B may include a plurality of magnet support portions respectively extending from the shaper body 222a to both sides. For example, the second shaper unit 222 may include a first protrusion 222b1, a second protrusion 222b2 branching from the shaper body 222a and extending to a first side thereof, and a third protrusion 222b3, a fourth protrusion 222b4 branching from the shaper body 222a and extending to a second side thereof.

In addition, the first protrusion 222b1 may include a first extension part b1p extending from the shaper body 222a to the first side, a first-second support part b1q and a first coupling groove bh1 disposed in the first-second support part b1q.

In addition, the second protrusion 222b2 may include the first extension part b1p, a second extension part b2p branching and extending from the shaper body 222a to the first side, a second-second support part b2q, and a second coupling groove b2h disposed in the second-second support part b2q.

In addition, the third protrusion 222b3 may include a third extension part b3p extending from the shaper body 222a to the second side, a third-second support part b3q, and a third coupling groove b3h disposed on the third-second support part b3q.

In addition, the fourth protrusion 222b4 may include the third extension part b3p, a fourth extension part b4p branching and extending from the shaper body 222a toward the second side, fourth-second support part b4q, and a fourth coupling groove b4h disposed in the fourth-second support part b4q.

In this case, referring to FIG. 23, in an embodiment, the first-second support part b1q which is the end of the first protrusion 222b1 and the second-second support part b2q which is the end of the second protrusion 222b2 can be connected to each other.

In addition, referring to FIG. 23, in the embodiment, the third-second support part b3q, which is the end of the third protrusion 222b3, and the fourth-second support part b4q, which is the end of the fourth protrusion 222b4 can be connected to each other.

FIG. 24 is an exemplary view of the operation of the second actuator 200 according to the embodiment, and the X-axis direction and Y-axis direction in FIG. 24 may be the same as or different from the previously illustrated directions.

Referring to FIG. 24, when power is applied to the second driving unit 72C and current flows through each coil, an electromagnetic force between the second driving unit 72C and the first driving unit 72M can be applied in the first direction or the second direction. The flexible plate 222cm may be tilted at a predetermined angle by the first driving unit 72M moved by the electromagnetic force, and the apex angle Θ of the variable prism 222cp may be controlled.

In this case, FIG. 25A is a characteristic when the second shaper unit 222B of the second actuator 200 according to the embodiment is operated. FIG. 25B is a characteristic when the first shaper unit 222A of the second actuator 200 according to the embodiment operates.

According to an un-disclosed internal experiment using the second shaper unit 222B in the embodiment, as shown in FIG. 25A, when the first-second support part b1q and the second-second support part b2q are connected to each other, and the third-second support part b3q and the fourth-second support part b4q are connected to each other, there is a change in the error range compared to the target value (ideal) when driving in each axial direction.

On the other hand, according to the un-disclosed experiment using the first shaper unit 222A in the embodiment, as shown in FIG. 25B, when the first support part b1e and the second support part b2e are spaced apart from each other by a second separation distance D2, or when the third support part b3e and the fourth support part b4e are separated from each other by a second separation distance D2, the amount of change is significantly reduced compared to the target value (ideal) when driving in each axial direction, resulting in a remarkable performance improvement effect.

That is, in the embodiment, when the first protrusion 222b1 and the second protrusion 222b2 are spaced apart, and the third protrusion 222b3 and the fourth protrusion 222b4 are spaced apart from each other, there is a special technical effect in that performance can be improved by remarkably reducing the amount of error change generated compared to the target value (ideal) when driving in each axial direction because it may have less influence on other protrusions when moving on x-axis or y axis.

Next, FIG. 26A is a first cross-sectional view of the second actuator 200 according to the embodiment, and FIG. 26B is a bottom perspective view of the second actuator 200 according to the embodiment.

Referring to FIGS. 26A and 26B, the second actuator 200 of the embodiment may include a second housing 210, an OIS unit 220 disposed on the second housing 210 and including a shaper unit 222, a first driving unit 72M, a second driving unit 72C disposed on the second housing 210, and a second-prism unit 230 disposed on the OIS unit 220.

According to the un-disclosed internal technology, when the shaper unit 222 is not firmly supported on the second housing 210, a technical problem in which a tilt occurs in the lens unit 222c and the prism unit 230 has been studied.

Accordingly, the embodiment may include a jig hole ZH in the second housing 210, during the assembly process of the second actuator 200, the assembly process may be performed in a state in which a predetermined jig (not shown) is firmly coupled to the jig hole ZH of the second housing 210.

The jig hole ZH may be provided in plurality, and may include first, second, third, and fourth jig holes ZH1, ZH2, ZH3, and ZH4. The jig may also include first, second, third, and fourth jigs.

For example, the second housing 210 may include first to fourth jig holes ZH1, ZH2, ZH3, ZH4 formed to overlap the first to fourth protrusions 222b1, 222b2, 222b3, 222b4 of the shaper body in a vertical direction.

The second housing 210 may include an opening 212H through which light formed between the first to fourth jig holes ZH1, ZH2, ZH3, and ZH4 can pass.

At this time, the jig may pass through the jig hole ZH and be led out to the upper side of the second housing 210, and the shaper unit 222 may be firmly disposed on the protruding jig.

The first to fourth jigs may be disposed to overlap first to fourth protrusions 222b1, 222b2, 222b3, 222b4 of the shaper body in a vertical direction.

Thereafter, the first driving unit 72M, the second driving unit 72C, and the like may be firmly coupled to the shaper unit 222, and there is a special technical effect of remarkably preventing the occurrence of a tilt.

According to the embodiment, there is a technical effect of providing an ultra-slim, ultra-compact actuator, and a camera module including the same.

In addition, according to the embodiment, there is a technical effect of providing an actuator and a camera module including the same, capable of securing a sufficient amount of light by removing a size limitation of a lens in a lens assembly of an optical system when implementing OIS.

In addition, according to the embodiment, there is a technical effect of providing an actuator and a camera module including the same, capable of exhibiting the best optical characteristics by minimizing the occurrence of a decent or a tilt phenomenon when implementing an OIS.

In addition, according to the embodiment, there is a technical effect of providing an actuator and a camera module including the same, capable of preventing magnetic field interference with an AF or zoom magnet when implementing OIS.

In addition, according to the embodiment, there is a technical effect of providing an actuator and a camera module including the same, capable of implementing OIS with low power consumption.

In addition, according to the embodiment, since the prism unit 230 and the lens unit 222c including the variable prism can be arranged very close, even if the optical path change is finely performed in the lens unit 222c, there is a special technical effect that the optical path change can be secured widely in the actual image sensor unit.

INDUSTRIAL APPLICABILITY

Next, FIG. 27 is a perspective view of a mobile terminal to which a camera module according to an embodiment is applied.

As shown in FIG. 27, the mobile terminal 1500 according to the embodiment may include a camera module 1000, a flash module 1530, and an autofocus device 1510 provided on a rear surface.

The camera module 1000 may include an image capturing function and an auto focus function. For example, the camera module 1000 may include an auto focus function using an image.

The camera module 1000 processes an image frame of a still image or a moving picture obtained by an image sensor in a photographing mode or a video call mode. The processed image frame may be displayed on a predetermined display unit and stored in a memory. A camera (not shown) may also be disposed in front of the mobile terminal body.

For example, the camera module 1000 may include a first camera module 1000A and a second camera module 1000B, and OIS can be implemented with an AF or zoom function by the first camera module 1000A. For example, the first camera module 1000A may include a first actuator that functions as an AF or zoom function and a second actuator that functions as an OIS function.

The flash module 1530 may include a light emitting device that emits light therein. The flash module 1530 may be operated by a camera operation of a mobile terminal or a user's control.

The autofocus device 1510 may include a package of a surface light emitting laser device as a light emitting unit.

The auto focus device 1510 may include an auto focus function using a laser. The autofocus device 1510 may be mainly used in a condition in which an autofocus function using an image of the camera module 1000 is deteriorated, for example, in a proximity or dark environment of 10 m or less. The autofocus device 1510 may include a light-emitting unit including a vertical cavity surface emission laser (VCSEL) semiconductor device, and a light-receiving unit that converts light energy such as a photodiode into electrical energy.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be construed as being included in the scope of the embodiments.

Although the embodiments have been described above, these are only examples and are not intended to limit the embodiments, and those of ordinary skill in the field to which the embodiment belongs will appreciate that various modifications and applications not illustrated can be made without departing from the essential characteristics of the embodiment. For example, each component specifically shown in the embodiment can be modified and implemented. And differences related to these modifications and applications should be construed as being included in the scope of the embodiments set in the appended claims.

The invention claimed is:

1. A camera module comprising:
a first circuit board on which an image sensor is disposed;
a first housing disposed on the first circuit board;
a lens assembly disposed in the first housing;
a second circuit board on which a gyro sensor is disposed and disposed on a first side portion of the first housing;
a third circuit board disposed on the first side portion of the first housing and having a first region in which a first coil driving the lens assembly is disposed;
a second housing disposed on the first housing;
a fixed prism disposed in the second housing; and
an OIS unit disposed between the second housing and the fixed prism,
wherein the first coil overlaps with the second circuit board in a direction perpendicular to an optical axis direction.

2. The camera module according to claim 1, further comprising a fourth circuit board connected to the second circuit board and on which a connector is disposed.

3. The camera module according to claim 1, wherein the third circuit board is disposed on a third side portion of the first housing, and
wherein the third circuit board includes a third region in which a second coil is disposed and a second region disposed on a second side portion connected between the first side portion and the third side portion of the first housing.

4. The camera module according to claim 1, wherein the first side portion of the first housing comprises a first end on which the second circuit board is disposed and a second end on which the first region of the third circuit board is disposed, and
wherein a step is formed by the first end and the second end.

5. The camera module according to claim 1, wherein the first side portion of the first housing comprises a hole, and the first coil is inserted into the hole.

6. The camera module according to claim 1, further comprising a shield cover in which the first housing is disposed, and the shield cover comprises a groove in which the gyro sensor is disposed.

7. The camera module according to claim 1, further comprising a fifth circuit board on which a third coil driving the OIS unit is disposed,
wherein the first housing and the second housing are disposed on the fifth circuit board, and the fifth circuit board is connected with the second circuit board, and
wherein the second housing includes a second hole, and the third coil is inserted into the second hole.

8. The camera module according to claim 7, wherein the fifth circuit board comprises a region disposed between the second side portion of the first housing and a fourth side portion facing the second side portion, and a region disposed on two sides portions of the second housing.

9. The camera module according to claim 1, wherein the OIS unit comprises a lens unit; a shaper unit; and a magnet coupled to the shaper unit and driving the lens unit,
wherein the second housing comprises a third hole in which a part of the lens unit is disposed, and
wherein the lens unit is configured to change a path of light transmitted from the fixed prism.

10. The camera module according to claim 9, wherein the shaper unit comprises a shaper body, and a protrusion extending laterally from the shaper body.

11. The camera module according to claim 10, wherein the OIS unit comprises a magnet coupled to the protrusion, and a coil coupled to the shaper body.

12. The camera module according to claim 10, wherein the protrusion comprises a first protrusion and a second protrusion respectively extending from the shaper body to one side.

13. The camera module according to claim 12, wherein an end of the first protrusion and an end of the second protrusion are spaced apart from each other.

14. The camera module according to claim 9, wherein the lens unit comprises a light-transmitting support part, a variable prism or a liquid lens.

15. The camera module according to claim 9, wherein the shaper unit is configured to drive the lens unit independently of the fixed prism.

* * * * *